(12) United States Patent
Matsui

(10) Patent No.: US 9,281,792 B2
(45) Date of Patent: Mar. 8, 2016

(54) RECEIVER AND METHOD FOR GAIN CONTROL

(71) Applicant: RENESAS ELECTRONICS CORPORATION, Kanagawa (JP)

(72) Inventor: Naohiro Matsui, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/487,145

(22) Filed: Sep. 16, 2014

(65) Prior Publication Data

US 2015/0117571 A1  Apr. 30, 2015

(30) Foreign Application Priority Data

Oct. 28, 2013  (JP) .................................. 2013-223361

(51) Int. Cl.
 *H04L 27/06* (2006.01)
 *H03G 3/30* (2006.01)
 *H04L 27/26* (2006.01)

(52) U.S. Cl.
 CPC ........... *H03G 3/3078* (2013.01); *H03G 3/3068* (2013.01); *H04L 27/2649* (2013.01)

(58) Field of Classification Search
 CPC ...................................................... H04B 14/02
 USPC ............................................................ 375/340
 See application file for complete search history.

(56) References Cited

U.S. PATENT DOCUMENTS

| | | | |
|---|---|---|---|
| 2009/0195255 A1* | 8/2009 | Kalokitis et al. | 324/522 |
| 2010/0040178 A1* | 2/2010 | Sutton et al. | 375/345 |
| 2011/0085625 A1 | 4/2011 | Urakawa et al. | |
| 2012/0076246 A1* | 3/2012 | Okada et al. | 375/340 |
| 2013/0058439 A1* | 3/2013 | Lin | 375/340 |

FOREIGN PATENT DOCUMENTS

| | | | |
|---|---|---|---|
| JP | 2009-016912 A | 1/2009 | |
| JP | 2011-087034 A | 4/2011 | |
| JP | 2011-211539 A | 10/2011 | |

* cited by examiner

*Primary Examiner* — Lihong Yu
(74) *Attorney, Agent, or Firm* — Mattingly & Malur, PC

(57) ABSTRACT

An RFVGA variably controls a gain according to an RFVGA gain control signal and amplifies and outputs a reception signal. A low-pass filter filters a signal output from a frequency converter. An OFDM demodulator generates a digital signal based on an output signal from the low-pass filter. A power detection evaluation circuit controls the RFVGA gain control signal based on a voltage value (DET0) of the RFVGA gain control signal or a voltage value (DET1) of the output signal from the RFVGA, and a voltage value (DET3) of an output signal from the low-pass filter and a voltage value (DET2) of an intermediate node of the low-pass filter.

15 Claims, 31 Drawing Sheets

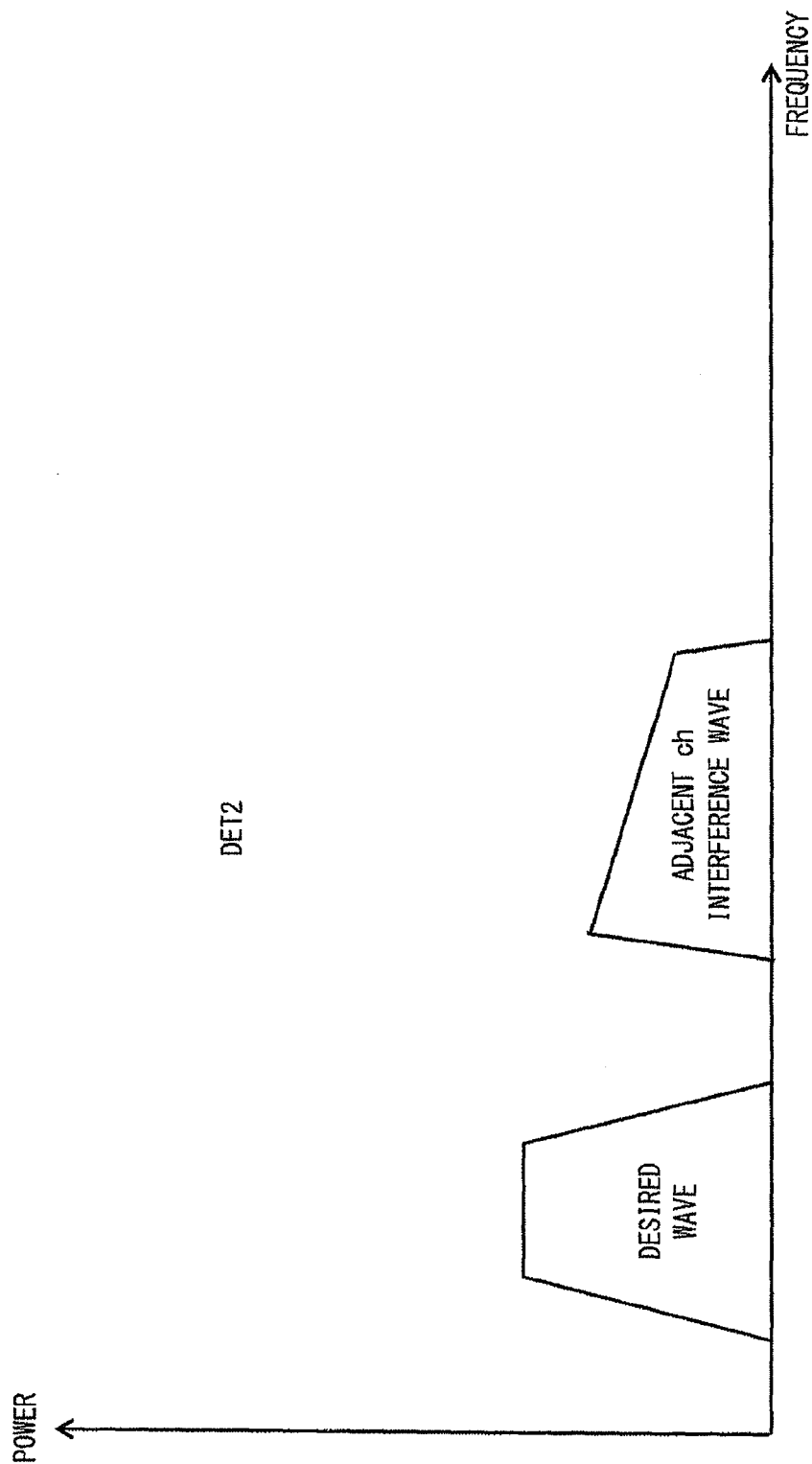

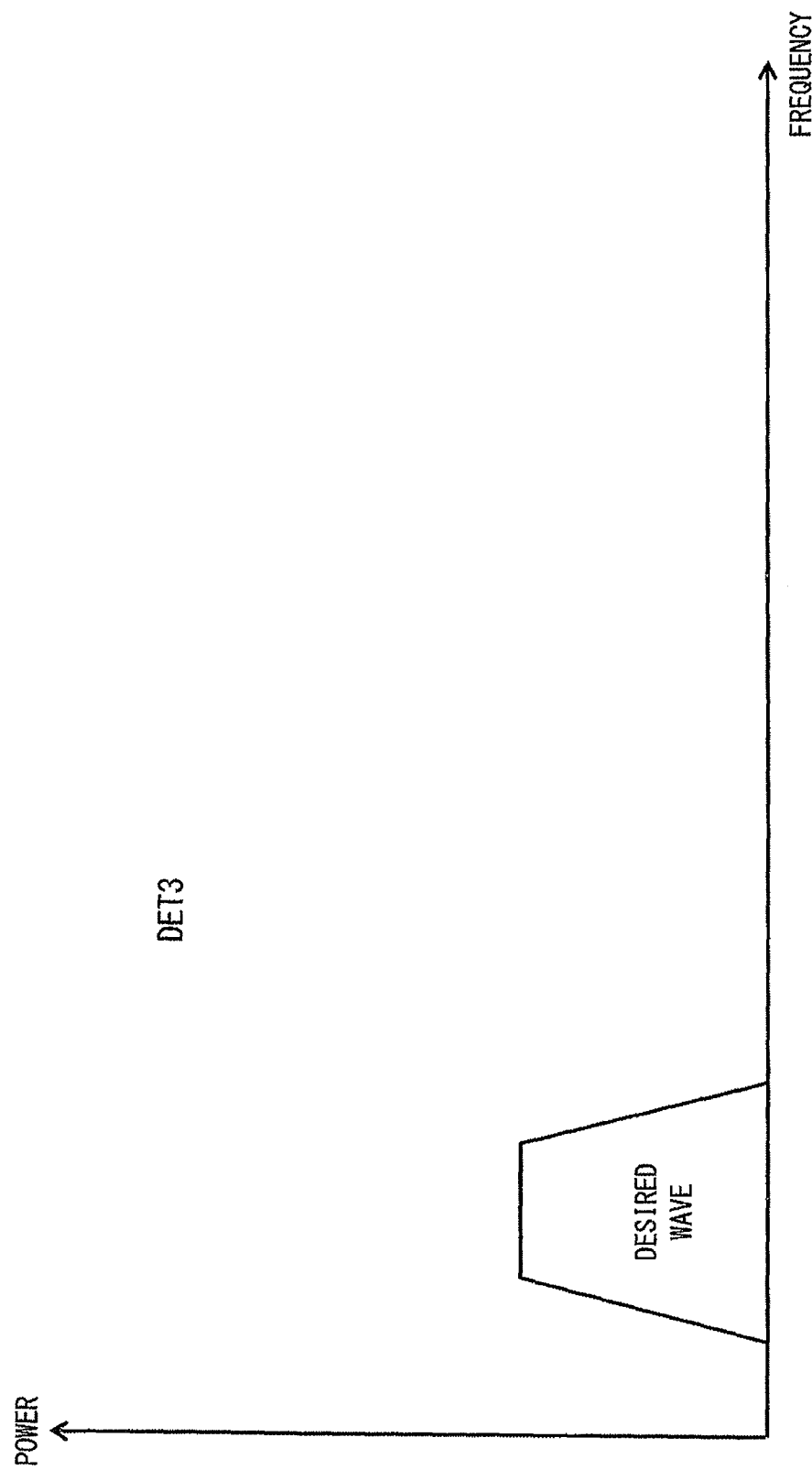

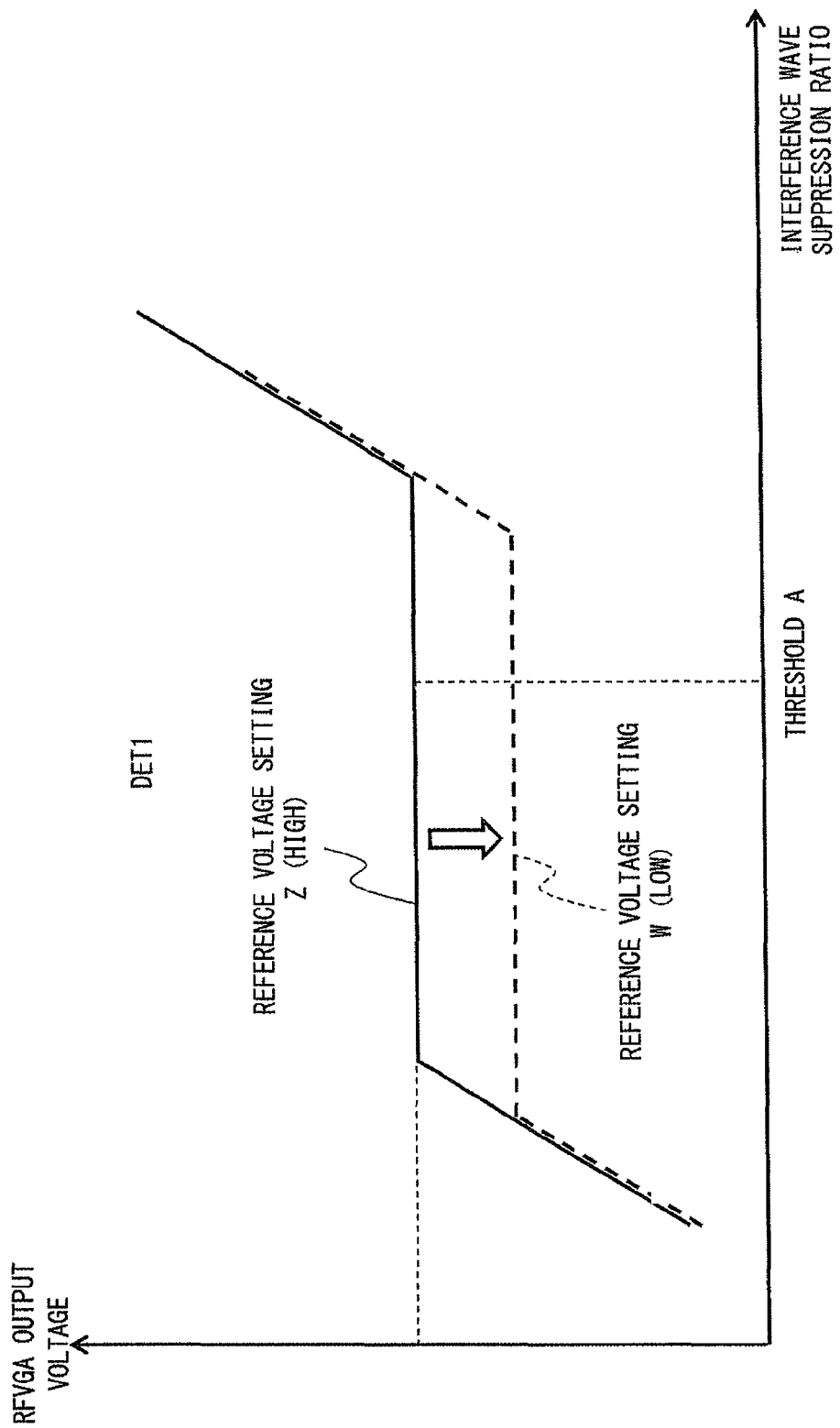

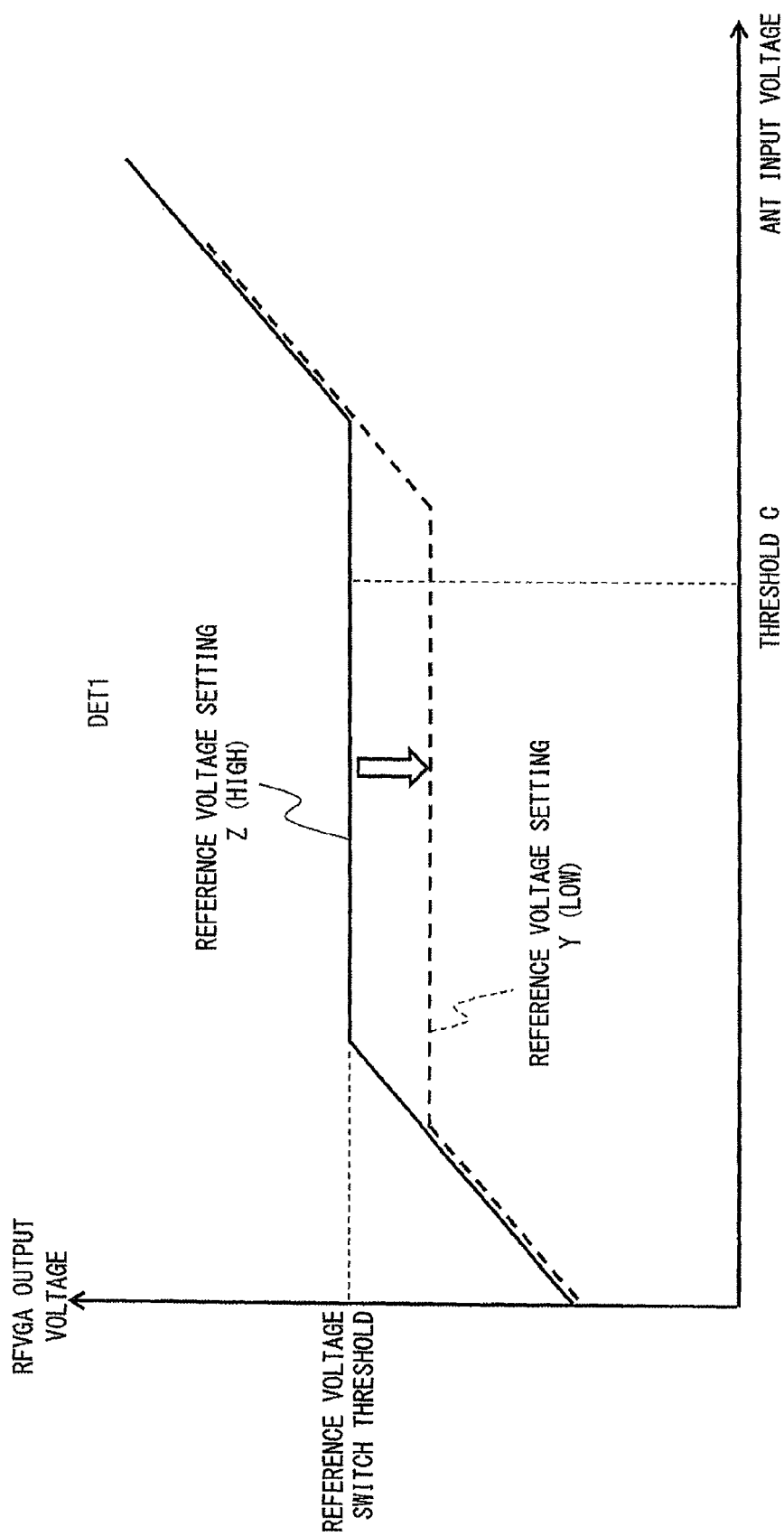

RECEIVER AND METHOD FOR GAIN CONTROL

CROSS-REFERENCE TO RELATED APPLICATIONS

This application is based upon and claims the benefit of priority from Japanese patent application No. 2013-223361, filed on Oct. 28, 2013, the disclosure of which is incorporated herein in its entirety by reference.

BACKGROUND

The present invention relates to a receiver and a method for gain control, and for example, to a receiver and a method for gain control for removing an interference wave component.

Superheterodyne receivers for converting a reception signal into an intermediate frequency signal and performing signal processing on the intermediate frequency signal are widely used. In general, a signal having a frequency which is a target frequency for reception (a desired wave) and a signal having an unnecessary frequency (an interference wave) are mixed in a signal that is input to a receiver. Therefore, various techniques for reducing an influence of the interference wave and improving reception performance have been developed. A technique for reducing the influence of the interference wave shall be explained below.

Japanese Unexamined Patent Application Publication No. 2011-87034 (Patent literature 1) discloses a reception circuit that can achieve a high interference wave suppression ratio in a case of receiving an interference wave having a frequency close to a desired wave, which has a target frequency for reception, and also in a case of receiving an interference wave having a frequency distant from the desired wave. The reception circuit includes an AGC loop, a filter group having an active filter that is provided in a stage subsequent to the AGC loop and a difference power detection unit for detecting an existence of the interference wave having a frequency close to the desired wave by detecting a differential voltage between an intermediate node and an output node of the filter group. The reception circuit further includes a switching circuit for switching convergence power of the AGC loop to reduce the convergence power of the AGC loop when the difference power detection unit detects the interference wave that is adjacent to the desired wave.

Japanese Unexamined Patent Application Publication No. 2011-211539 (Patent literature 2) discloses a receiver that has realized an improvement in an interference wave suppression ratio in a manner similar to Patent literature 1. The receiver has a configuration in which an evaluation is performed on whether or not an interference wave received together with a desired wave is an interference wave adjacent to the desired wave, and control is performed on an AGC loop according to the evaluation.

Japanese Unexamined Patent Application Publication No. 2009-16912 (Patent literature 3) discloses a gain control circuit for detecting an existence of a disturbing wave (an interference wave), and when the disturbing wave is detected, the gain control circuit detects TOP (a setting level for determining a gain which will be set to an amplifier) that can achieve a favorable BER (Bit Error Rate) while changing the TOP.

SUMMARY

The receivers disclosed by Patent literature 1 and Patent literature 2 control the AGC loop based on an existence or absence of the interference wave (an interference wave 1 in Patent literature 1 and Patent literature 2) of the channel that is adjacent to the desired wave so as to improve the interference wave suppression ratio. However, when the receiver receives terrestrial television waves, there is a problem in which a reception characteristic cannot be sufficiently improved only by the control based on the existence or absence of the interference wave of the channel adjacent to the desired wave. Similarly, there is a problem also in the technique disclosed by Patent literature 3 in which the reception characteristic cannot be sufficiently improved because control is performed using the existence or absence of the disturbing wave as an evaluation criterion.

In other words, in the techniques disclosed by Patent literature 2 and Patent literature 3, appropriate control based on a correct evaluation on a reception state is not performed on the receiver, thereby leading to a problem in which sufficient interference wave tolerance cannot be achieved.

Other issues and new features will be apparent from the description of the specification and attached drawings.

An aspect of the present invention is a receiver including a configuration of performing evaluation processing regarding a plurality of kinds of poor reception states based on at least one of a voltage value of a gain control signal for controlling a gain of an amplifier that amplifies a reception signal, a voltage value of an output signal from the amplifier, and a voltage value of the reception signal, a voltage value of an output signal from the filter circuit for filtering an output from the amplifier, and a voltage value of an intermediate node of the filter circuit, and controlling the gain control signal according to the evaluation.

According to the above aspect, it is possible to provide a receiver and a method for gain control that can achieve a highly accurate interference wave characteristic.

BRIEF DESCRIPTION OF THE DRAWINGS

The above and other aspects, advantages and features will be more apparent from the following description of certain embodiments taken in conjunction with the accompanying drawings, in which:

FIG. 6B is a conceptual diagram showing a power value in an intermediate node of the low-pass filter 12 according to the first embodiment;

FIG. 6C is a conceptual diagram showing a power value in an output stage of the low-pass filter 12 according to the first embodiment;

FIG. 7A is a diagram showing a relationship between an output voltage (DET1) from an RFVGA 101 and the interference wave suppression ratio (the D/U ratio) according to the first embodiment;

FIG. 9A is a diagram showing a relationship between the output voltage value (DET1) from the RFVGA 101 and the ANT input voltage according to the first embodiment;

DETAILED DESCRIPTION

Figure 1:
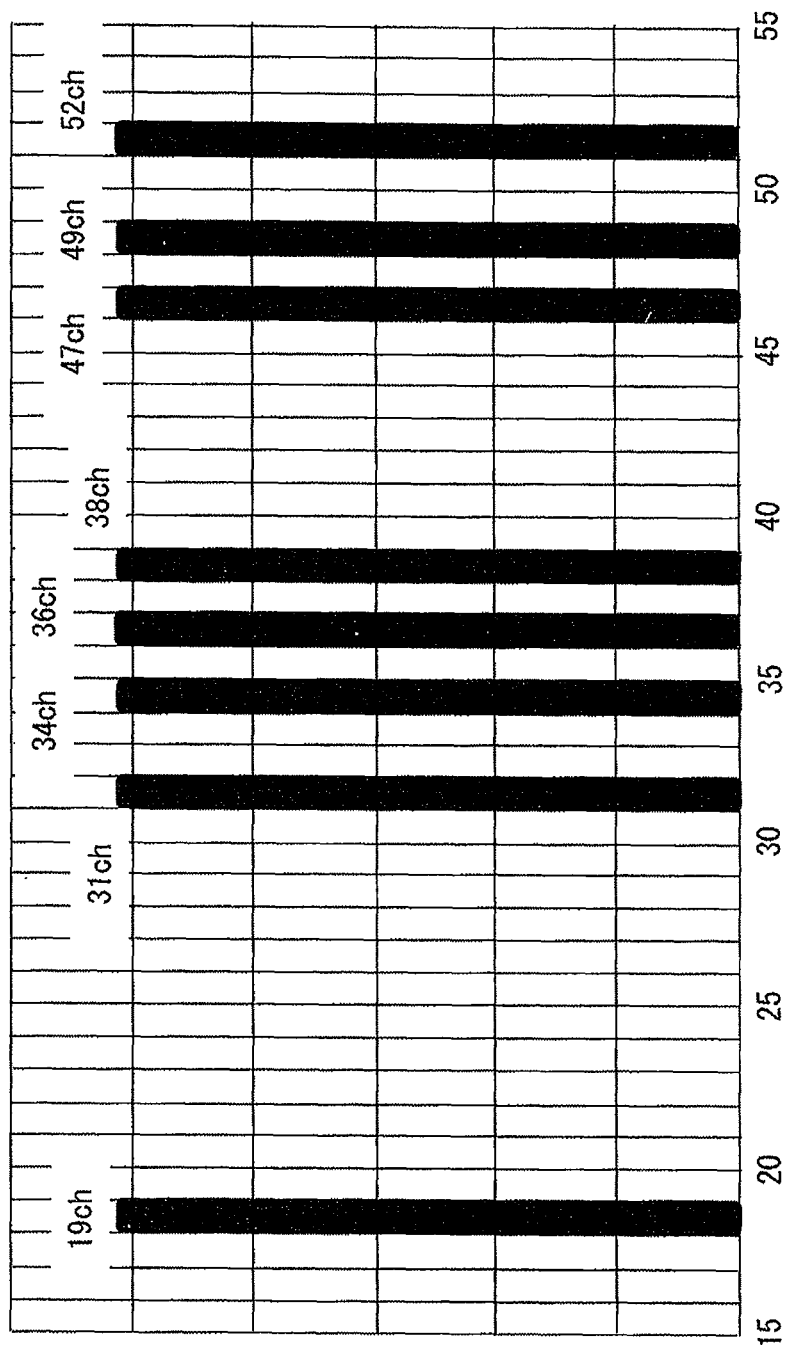
FIG. 1 is a conceptual diagram showing a relationship between reception channels at a certain satellite station.

Hereinafter, a configuration and an operation of a receiver according to this embodiment shall be explained with reference to the drawings. The following description and drawings are omitted and simplified as appropriate for clarity of the explanation. Note that the same components are denoted by the same reference numerals throughout the drawings, and a repeated explanation shall be omitted as necessary.

The above-mentioned problems in patent literature that are mentioned in Background shall be explained again in detail using the drawings. Firstly, a relationship between reception channels of terrestrial digital television shall be explained with reference to FIG. 1. FIG. 1 is a diagram showing a relationship between reception channels of Odawara satellite station in Kanagawa prefecture, Japan. A case in which a first problem occurs in the above-mentioned techniques disclosed by Patent literature 1, Patent literature 2, and Patent literature 3 shall be explained using FIGS. 1 and 2.

In a region for receiving waves from the satellite station shown in FIG. 1, broadcasting channels are arranged at an equal interval, such as channel 34, channel 36, and channel 38. When the receiver attempts to receive channel 34 (i.e., when the desired wave is channel 34), all the remaining channels will be interference waves. When the power levels of channel 36 and channel 38 are high, intermodulation distortion components appear in channel 34 and channel 40, which are channels distant from channel 36 and channel 38 by channel 2 in the receiver. Thus, the intermodulation distortion component is added to channel 34, which is the desired wave, thereby causing the reception performance to deteriorate.

Figure 2:
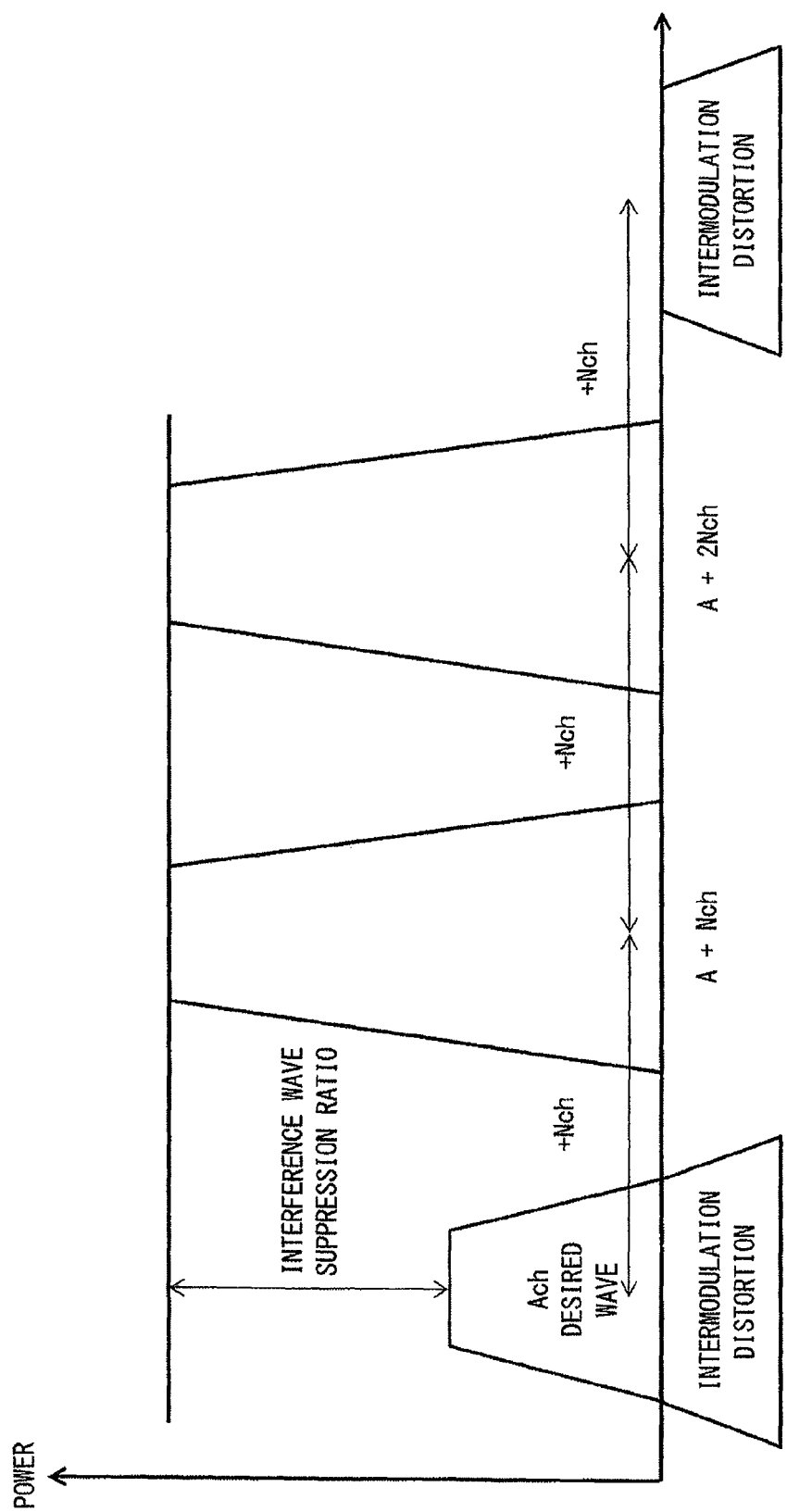
FIG. 2 is a conceptual diagram showing a relationship between reception channels and intermodulation distortion.

An explanation shall continue with reference to FIG. 2. As shown in FIG. 2, channels are arranged at an interval of N channel (A channel, A+N channel, and A+2N channel). As power levels of A+N channel and A+2N channel are high, intermodulation distortion is generated. As shown in FIG. 2, the intermodulation distortion components appear in Ach (i.e., the desired wave) and A+3N channel that are distant from A+Nch and A+2N channel, respectively, by N channel. The interference wave tolerance deteriorates by a distortion characteristic appeared in the desired wave.

Figure 3:
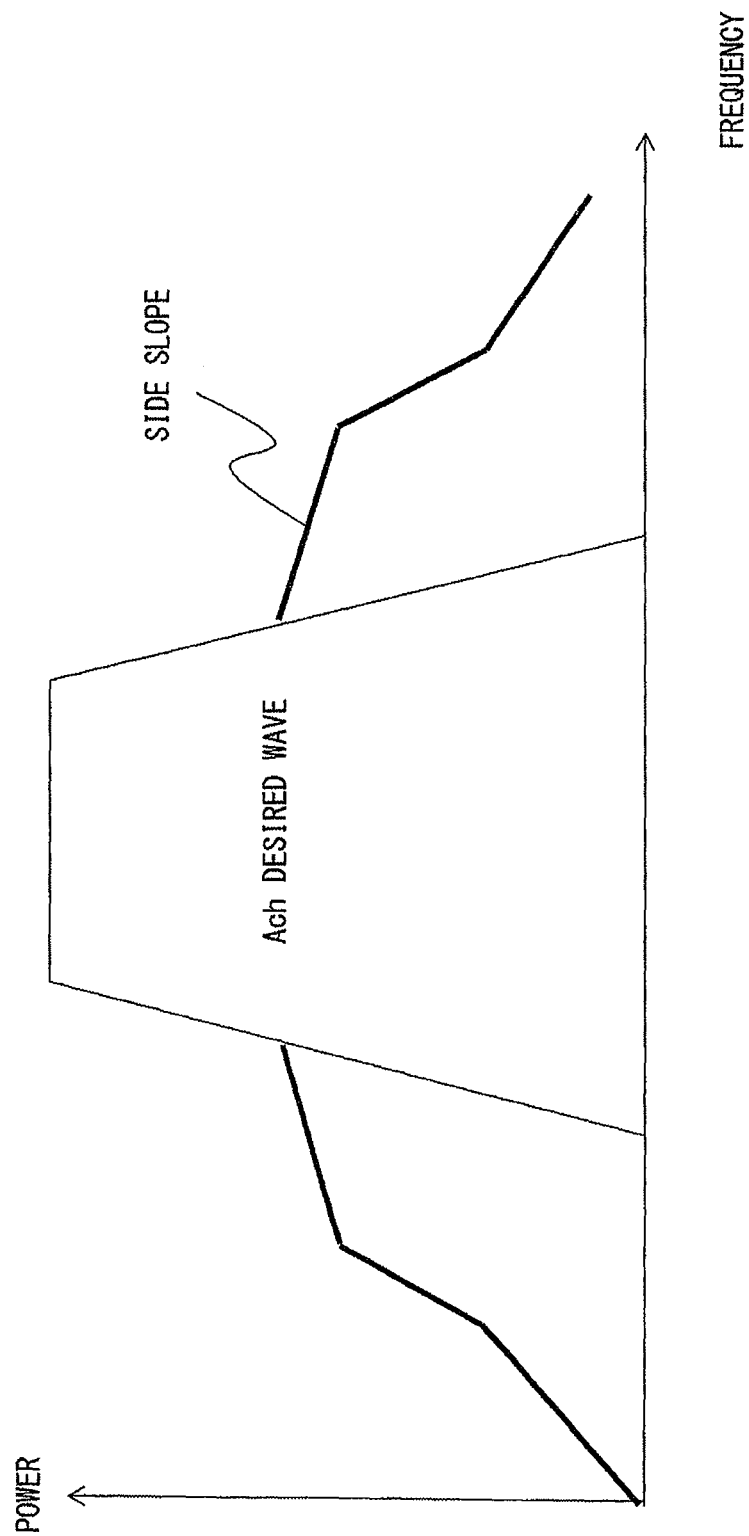
FIG. 3 is a conceptual diagram showing a relationship between a power level of a desired wave and a side slope.

Next, a second case in which a problem occurs in the above-mentioned receivers disclosed by Patent literature 1, Patent literature 2, and Patent literature 3 shall be explained with reference to FIG. 3. FIG. 3 illustrates a case in which a power level of the desired wave is extremely high. For example, when the satellite station or the like and the receiver are located at places physically close to each other, a desired wave having great power as shown in FIG. 3 is input to the receiver. When the power level of the desired wave is high, a side slope (i.e., noise) is generated due to intermodulation distortion of the desired wave itself, as shown in FIG. 3. The reception performance of the receiver may deteriorate due to the side slope.

As described above, the receivers disclosed by Patent literature 1 and Patent literature 2 control the AGC loop based on the existence or absence of the interference wave (the interference wave 1) of the channel that is adjacent to the desired wave. The gain control circuit disclosed by Patent literature 3 also performs reception control based only on the existence or absence of the disturbing wave. Accordingly, the cases shown in FIGS. 2 and 3 cannot be handled by the above-mentioned related art, leading to insufficient reception performance.

Figure 4:
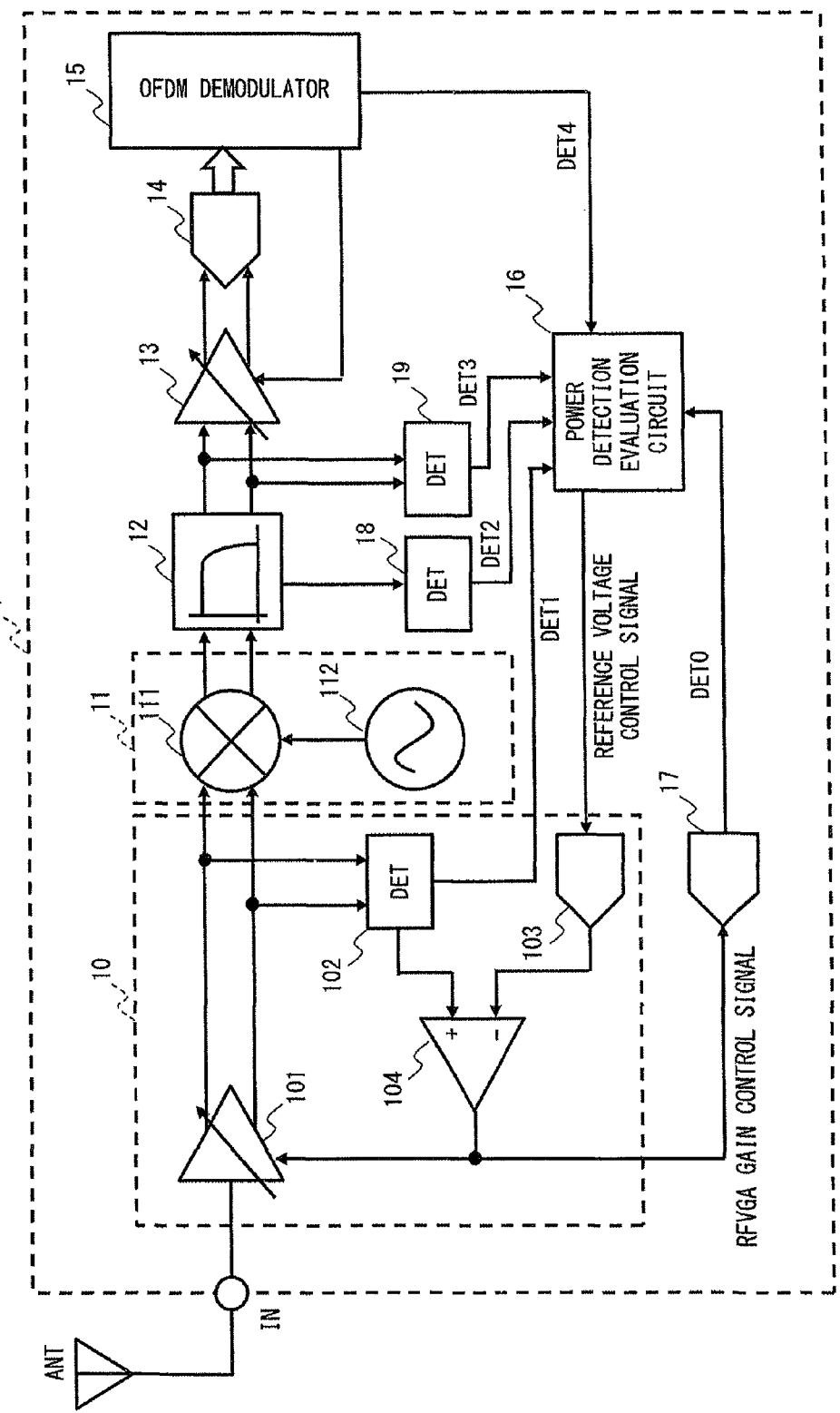
FIG. 4 is a block diagram showing a configuration of a receiver 1 according to a first embodiment.

Next, a configuration of the receiver according to this embodiment shall be explained. FIG. 4 is a block diagram showing the configuration of the receiver according to this embodiment. A receiver 1 includes an RFAGC loop circuit 10, a frequency converter 11, a low-pass filter 12, an IF gain variable amplifier 13, an A/D converter 14, an OFDM demodulator 15, a power detection evaluation circuit 16, an A/D converter 17, a power detector (DET) 18, and a power detector (DET) 19.

The RFAGC loop circuit 10 amplifies a reception signal that is input to an input terminal IN from an antenna ANT. The RFAGC loop circuit 10 includes an RFVGA (a high frequency variable gain amplifier) 101, a power detector (DET) 102, a D/A converter 103, and a differential amplifier 104.

The RFVGA 101 amplifies the reception signal that is input to the input terminal IN from the antenna ANT and supplies the amplified signal to the frequency converter 11 and the power detector 102. The RFVGA 101 has a function that varies a gain based on an RFVGA gain control signal (also referred to as merely gain control signal) that is output from the differential amplifier 104. The power detector 102 detects a voltage value (DET1) of an output signal from the RFVGA 101 and supplies the voltage value to the power detection evaluation unit 16 and the differential amplifier 104. The D/A converter 103 generates a reference voltage by converting a reference voltage control signal that is input from the power detection evaluation circuit 16 into an analog signal. The differential amplifier 104 supplies a signal that is obtained by amplifying a differential voltage between the reference voltage output from the D/A converter 103 and the output voltage from the power detector 102 to the RFVGA 101 and the A/D converter 17.

The frequency converter 11 includes a mixer 111 and a local oscillator 12. The mixer circuit 111 synthesizes a frequency oscillated by the local oscillator 112 and the output signal from the RFVGA 101 and generates an intermediate frequency signal. The mixer circuit 111 supplies the generated intermediate frequency signal to the low-pass filter 12.

The intermediate frequency signal is input to the low-pass filter 12 from the frequency converter 11. The low-pass filter 12 lets signals having a predetermined frequency (a cutoff frequency) or less through and blocks other signals. The low-pass filter 12 has a multi-stage structure including an active element, and an intermediate node of the low-pass filter 12 is connected to the power detector 18. The internal configuration of the low-pass filter 12 may be the same as the configuration shown in, for example, FIG. 8 disclosed by Patent literature 1. The low-pass filter 12 supplies the filtered signal to the IF gain variable amplifier 13 and the power detector 19.

The IF gain variable amplifier 13 amplifies a signal input from the low-pass filter 12 and supplies the amplified signal to the A/D converter 14. The IF gain variable amplifier 13 varies the gain based on the IF gain control signal that is input from the OFDM demodulator 15. The A/D converter 14 converts the input signal from the IF gain variable amplifier 13 into a digital signal and supplies the digital signal to the OFDM demodulator 15.

The OFDM demodulator 15 demodulates the input digital signal. Further, the OFDM demodulator 15 calculates CNR (Carrier-Noise Ratio, also referred to as quality voltage information) based on the input digital signal and supplies the calculated CNR to the power detection evaluation circuit 16 as a voltage value (DET 4).

The power detector 18 is connected to the intermediate node of the low-pass filter 12 and supplies a voltage value (DET2) of the low-pass filter 12 to the power detection evaluation circuit 16. The power detector 19 detects a voltage value (DET3) of the output signal from the low-pass filter 12 and supplies the voltage value to the power detection evaluation circuit 16. The A/D converter 17 supplies a voltage value (DET0) of the RFVGA gain control signal that is output from the differential amplifier 104 to the power detection evaluation circuit 16.

The power detection evaluation circuit 16 performs evaluation processing regarding a plurality of kinds of poor reception states based on the input voltage values (DET0) to (DET4). Then, the power detection evaluation circuit 16 generates a reference voltage control signal based on the evaluated reception state and supplies the reference voltage control signal to the D/A converter 103. The reference voltage control signal generates the reference voltage on which an operation of the RFAGC loop circuit 10 will be based. That is, the power detection evaluation circuit 16 changes the reference voltage based on the reception state that is evaluated from the voltage values (DET0) to (DET4) so as to control the RFVGA gain control signal, thereby controlling the operation of the RFAGC loop circuit 10. The control processing of the power detection evaluation circuit 16 shall be explained in detail with reference to FIGS. 5 to 9.

Figure 5:
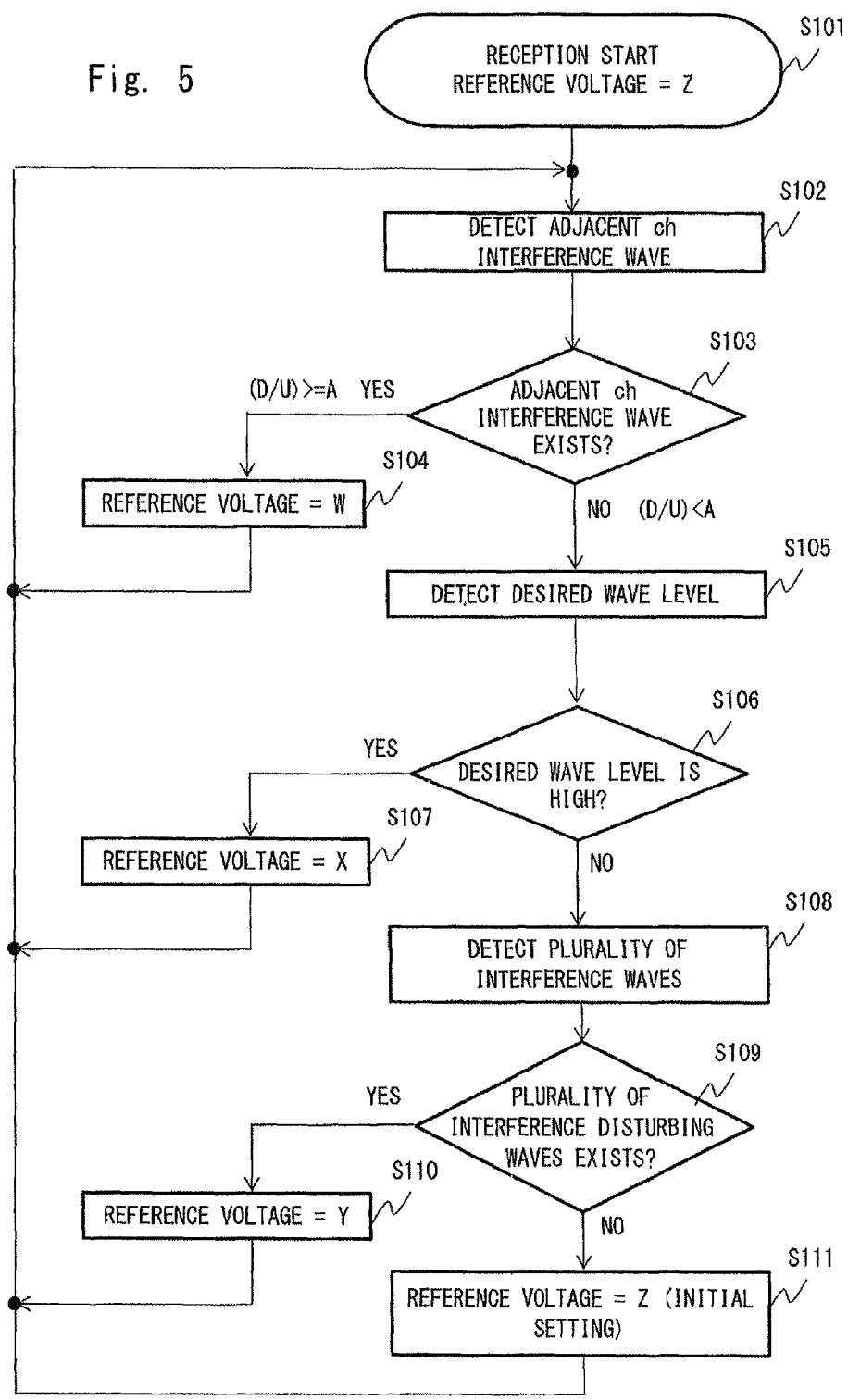
FIG. 5 is a flowchart showing evaluation processing by a power detection evaluation circuit 16 according to the first embodiment.

Before referring to FIG. 5, a relationship between the RFAGC loop circuit 10 and the reference voltage shall be explained. Note that in the following explanation, the voltage of the output signal from the RFAGC loop circuit 10 (the voltage of the output signal from the RFVGA 101) shall also be referred to as a "convergence voltage of the RFAGC loop circuit 10 (or a convergence voltage of the RFVGA 101)". When a input voltage of the reception signal that is input to the input terminal IN via the antenna ANT (hereinafter also referred to as an "ANT input voltage") is A[dBm] and the gain of the RFVGA 101 is B[dB], and the convergence voltage of the RFAGC loop circuit 10 is C[dBm], "A+B=C" is satisfied. Therefore, the gain B[dB] gradually decreases with an increase in the ANT input voltage A[dBm].

As described above, the gain of the RFVGA 101 is controlled by the RFVGA gain control signal that is output from the differential amplifier 104. The differential amplifier 104 outputs a signal that is obtained by amplifying a differential voltage between the reference voltage and the output voltage from the RFVGA 101, as the RFVGA gain control signal. Accordingly, when the reference voltage is set to be low, the convergence voltage of the RFAGC loop circuit 10 will become low. Meanwhile, when the reference voltage is set to be high, the convergence voltage of the RFAGC loop circuit 10 will become high. When the power detection evaluation circuit 16 detects a poor reception, the power detection evaluation circuit 16 performs control in such a manner to reduce the reference voltage so that the convergence voltage of the RFAGC loop circuit 100 will become low. Details shall be explained with reference to FIGS. 5 to 9.

Referring now to FIG. 5, FIG. 5 is a flowchart showing a flow of the evaluation of the reception state and reference voltage setting by the power detection evaluation circuit 16. The power detection evaluation circuit 16 assumes a state in which there is no interference wave at the time of reception start, and input power of the desired wave is low (S101). Therefore, the power detection evaluation circuit 16 outputs the reference voltage control signal so that the reference voltage=Z, which is a setting in which the convergence power of the RFAGC loop circuit 10 will become high (S101).

Next, the power detection evaluation circuit 16 detects an interference wave of a channel that is adjacent to the desired wave (this interference wave shall be hereinafter also referred to as an "adjacent channel interference wave", and an interference wave of a channel that is not adjacent to the desired wave shall also be referred to as a "non-adjacent channel interference wave") (S102), and evaluates whether or not the adjacent channel interference wave exists at a power level for deteriorating the reception performance (S103). The power detection evaluation circuit 16 detects the adjacent channel interference wave based on a voltage difference between the voltage value (DET2) and the voltage value (DET3). When the adjacent channel interference wave is detected at a certain level or greater (S103: Yes), the power detection evaluation circuit 16 outputs the reference voltage control signal so that the reference voltage=W (W<Z) (S104). The detection processing of the adjacent channel interference wave by the power detection evaluation circuit 16 shall be explained with reference to FIGS. 6A to 6D.

Figure 6A:
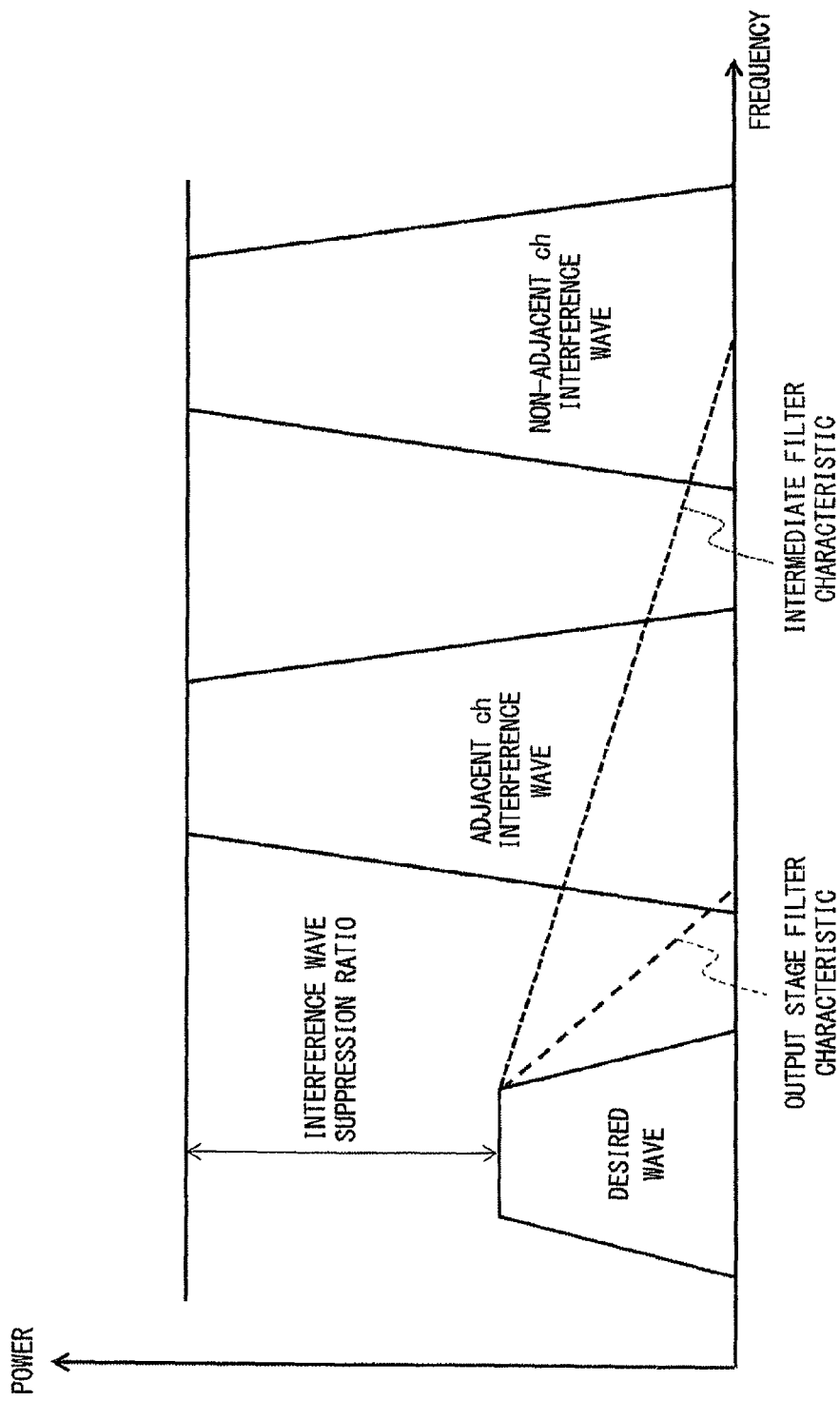
FIG. 6A is a conceptual diagram showing a power value in an input stage of a low-pass filter 12 according to the first embodiment.

FIG. 6A is a conceptual diagram showing power values in an input stage of the low-pass filter 12. As this diagram shows a state before filtering, the power values of the interference wave, the adjacent channel interference wave, and the non-adjacent channel interference wave are high. By a multi-stage structure of an active filter inside the low-pass filter 12, an attenuation characteristic is steep. Accordingly, as shown in FIG. 6A, the attenuation characteristic in an output stage of the low-pass filter 12 (an output stage Filter characteristic) is steep, while the attenuation characteristic in the intermediate node of the low-pass filter 12 (an intermediate Filter characteristic) is more gentle than the attenuation characteristic of the output stage.

FIG. 6B is a conceptual diagram showing the power value (i.e., the voltage value (DET2)) in the intermediate node of the low-pass filter 12. As the attenuation characteristic of the intermediate of the low-pass filter 12 is gentle, the non-adjacent channel interference wave greatly attenuates, but a power component of the adjacent channel interference wave remains. FIG. 6C is a conceptual diagram showing a power value (i.e., the voltage value (DET3)) in the output stage of the low-pass filter 12. As shown in the drawings, the adjacent channel interference wave greatly attenuates in a manner similar to the non-adjacent channel interference wave.

Figure 6D:
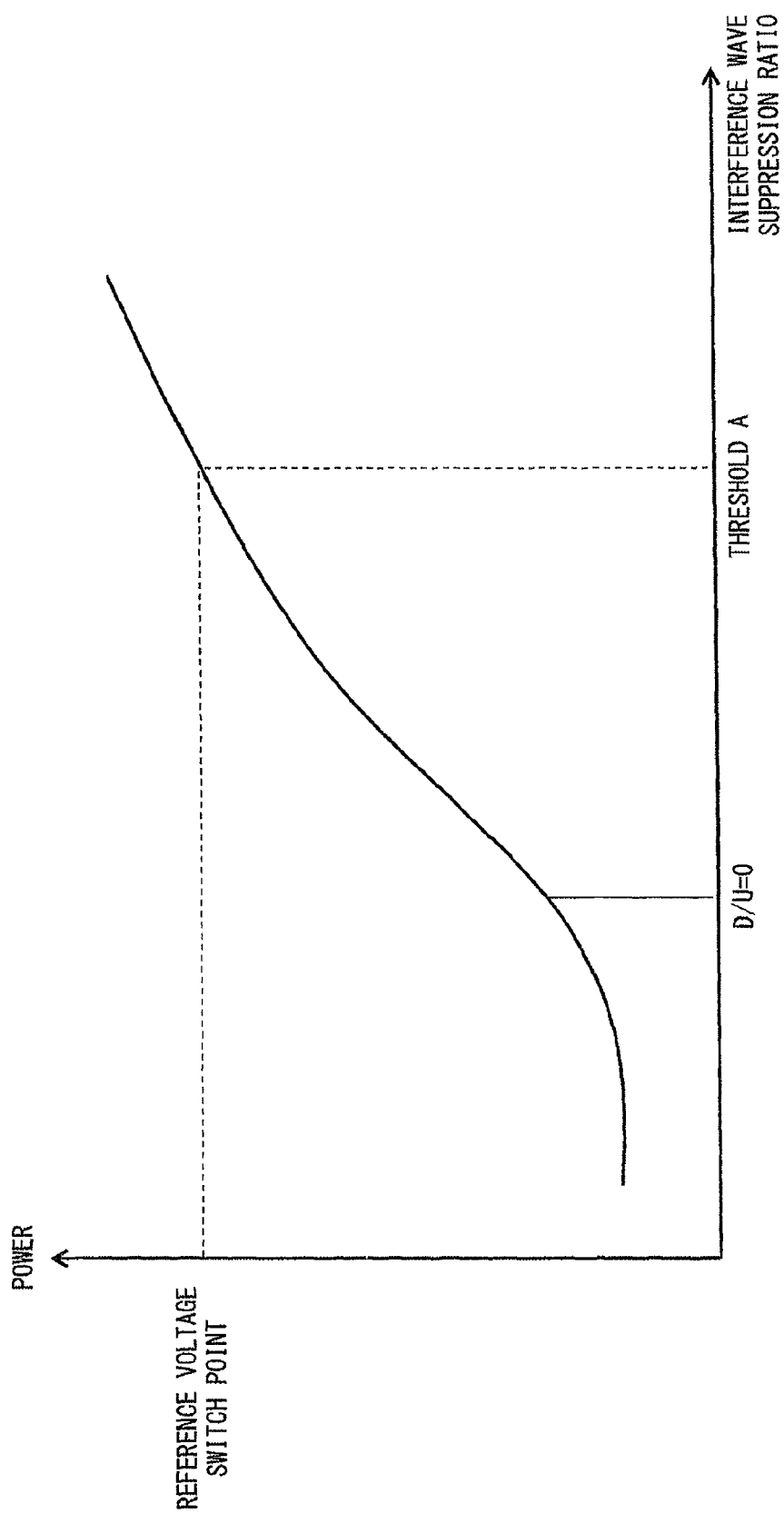
FIG. 6D is a diagram showing a relationship between an interference wave suppression ratio (a D/U ratio) and a differential voltage (DET2−DET3)

The power detection evaluation circuit 16 detects the adjacent channel interference wave based on the characteristics shown in FIGS. 6A to 6C. Specifically, the power detection evaluation circuit 16 calculates the differential voltage between the output value (DET2) from the voltage detector 18 and the output voltage (DET3) from the voltage detector 19 so as to retrieve a component of the adjacent channel interference wave. The power detection evaluation circuit 16 estimates a desired wave-to-disturbing wave ratio (which is a D/U ratio and also referred to as an interference wave suppression ratio) by the calculated component. FIG. 6D is a diagram showing a relationship between the interference wave suppression ratio (the D/U ratio) and the differential voltage (DET2−DET3). As shown in FIG. 6D, the greater the differential voltage (DET2−DET3), the greater the interference wave suppression ratio (the D/U ratio). The power detection evaluation circuit 16 evaluates whether or not the adjacent channel interference wave exists at the power level for deteriorating the reception performance according to whether or not the D/U ratio is greater than a threshold A (a first threshold). A relationship between the threshold A and the voltages (DET1, DET0, and DET4) that are the voltages before and after the setting of the reference voltage=Z shall be explained with reference to FIGS. 7A to 7C.

Figure 7B:
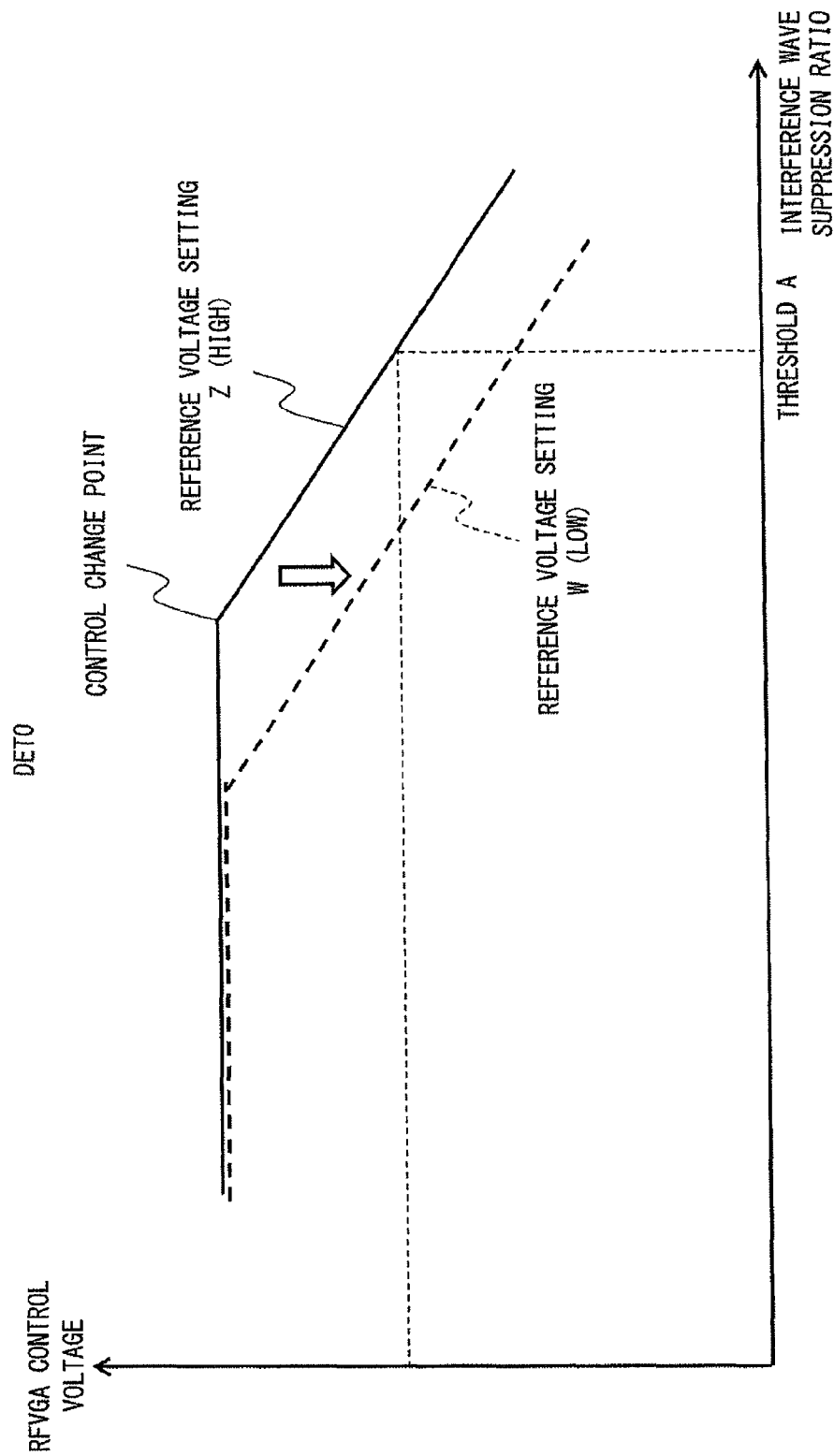
FIG. 7B is a diagram showing a relationship between a voltage of an RFVGA gain control signal (an output signal from a differential amplifier 104, DET0) and the interference wave suppression ratio according to the first embodiment.
Figure 7C:
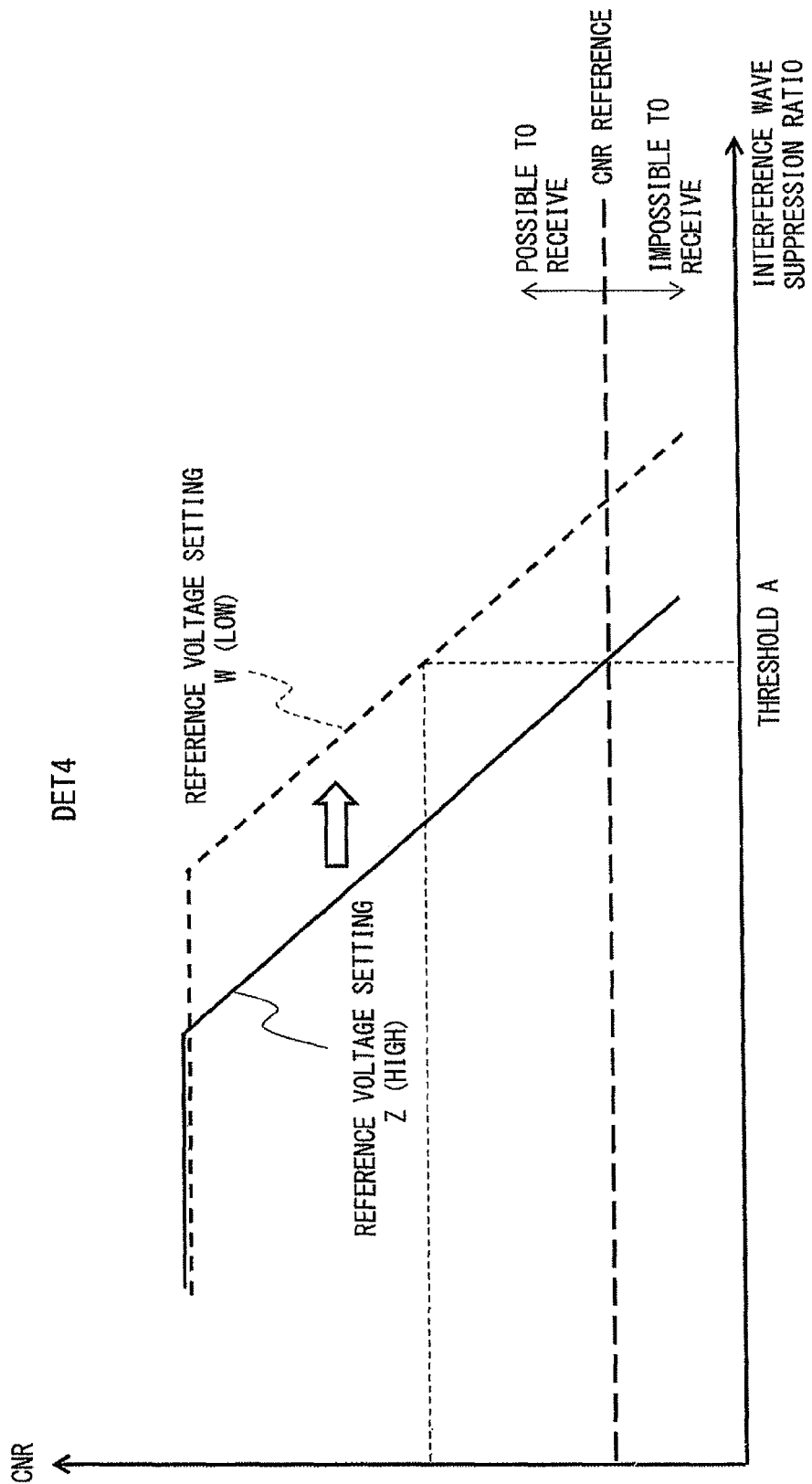
FIG. 7C is a diagram showing a relationship between CNR (DET4) that is output from an OFDM demodulator 16 and the interference wave suppression ratio according to the first embodiment.

FIG. 7A is a diagram showing a relationship between the output voltage (DET1) from the RFVGA 101 and the interference wave suppression ratio (the D/U ratio). FIG. 7B is a diagram showing a relationship between the voltage of the RFVGA gain control signal (the output signal from the difference amplifier 104, DET0) and the interference wave suppression ratio. FIG. 7C is a diagram showing a relationship between the CNR (DET4) that is output from the OFDM demodulator 16 and the interference wave suppression ratio. In FIG. 7A to 7C, solid lines indicate voltage transitions before the reference voltage setting is changed (i.e., the reference voltage=Z), while dotted lines indicate voltage transitions after the reference voltage setting is changed (i.e., the reference voltage=W).

As shown in FIG. 7A, even when the interference wave suppression ratio increases, the convergence voltage of the RFVGA 101 is constant in the range of the interference suppression ratio where the control of the RFAGC loop circuit 10 is effective (see the solid line in FIG. 7A). However, as shown in FIG. 7B, in order to maintain the output voltage from the RFVGA 101 to be constant, the greater the interference wave suppression ratio, the smaller the voltage value (DET0) of the RFVGA gain control signal. When the reference voltage=Z, that is, when the reference voltage is set to be high (the solid line in FIG. 7B), a point where the voltage of the RFVGA gain control signal starts to change (an RFAGC gain control change point) will be a value in which the interference wave suppression ratio is high. Thus, intermodulation distortion of the interference wave is generated, and as shown in FIG. 7C, the CNR (DET4) deteriorates (the solid line in FIG. 7C) with an increase in the interference wave suppression ratio.

As described above, the power detection evaluation circuit 16 calculates the interference wave suppression ratio by the differential voltage between the output voltage (DET2) from the power detector 18 and the output voltage (DET3) from the voltage detector 19. The power detection evaluation circuit 16 determines the threshold A based on the value of the CNR which will be impossible to be received and compares the threshold A with the calculated value of the interference wave suppression ratio. When the calculated value of the interference wave suppression ratio increases to be equal to or greater than the threshold A, the power detection evaluation circuit 16 changes the reference voltage to W (W<Z).

When the reference voltage is reduced, the value of the convergence voltage of the RFVGA 101 decreases (the dotted line in FIG. 7A). Consequently, the point where the voltage of the RFVGA gain control signal starts to change (the RFAGC gain control change point) moves to a point where the interference wave suppression ratio is smaller (the dotted line in FIG. 7B), and thus it is more insusceptible by the intermodulation distortion of the interference wave. As the influence of the intermodulation distortion of the interference wave is reduced, the CNR improves (the dotted line in FIG. 7C), thereby improving the reception performance.

Note that as the mechanism for improving the reception performance by reducing the reference voltage at the time of inputting the adjacent channel interference wave so as to reduce the AGC loop (the RFAGC loop circuit 10) is disclosed in the paragraphs 0017 to 0024 by Patent literature 1, see the corresponding paragraphs as appropriate.

Referring back to FIG. 5, when the adjacent channel interference wave is not detected at a predetermined level (S103: No) the power detection evaluation circuit 16 detects the desired wave (S105) and evaluates whether or not the power level of the desired wave is greater than or equal to a certain value (S106). When the power level of the desired wave is greater than or equal to the certain value (S106: Yes), the power detection evaluation circuit 16 outputs the reference voltage control signal so that the reference voltage=X (W<=X<Z) (S107). When the power level of the desired wave is not greater than or equal to the certain value (S106: No), the power detection evaluation circuit 16 performs plural interference waves detection processing (108), which will be explained later.

Figure 8A:
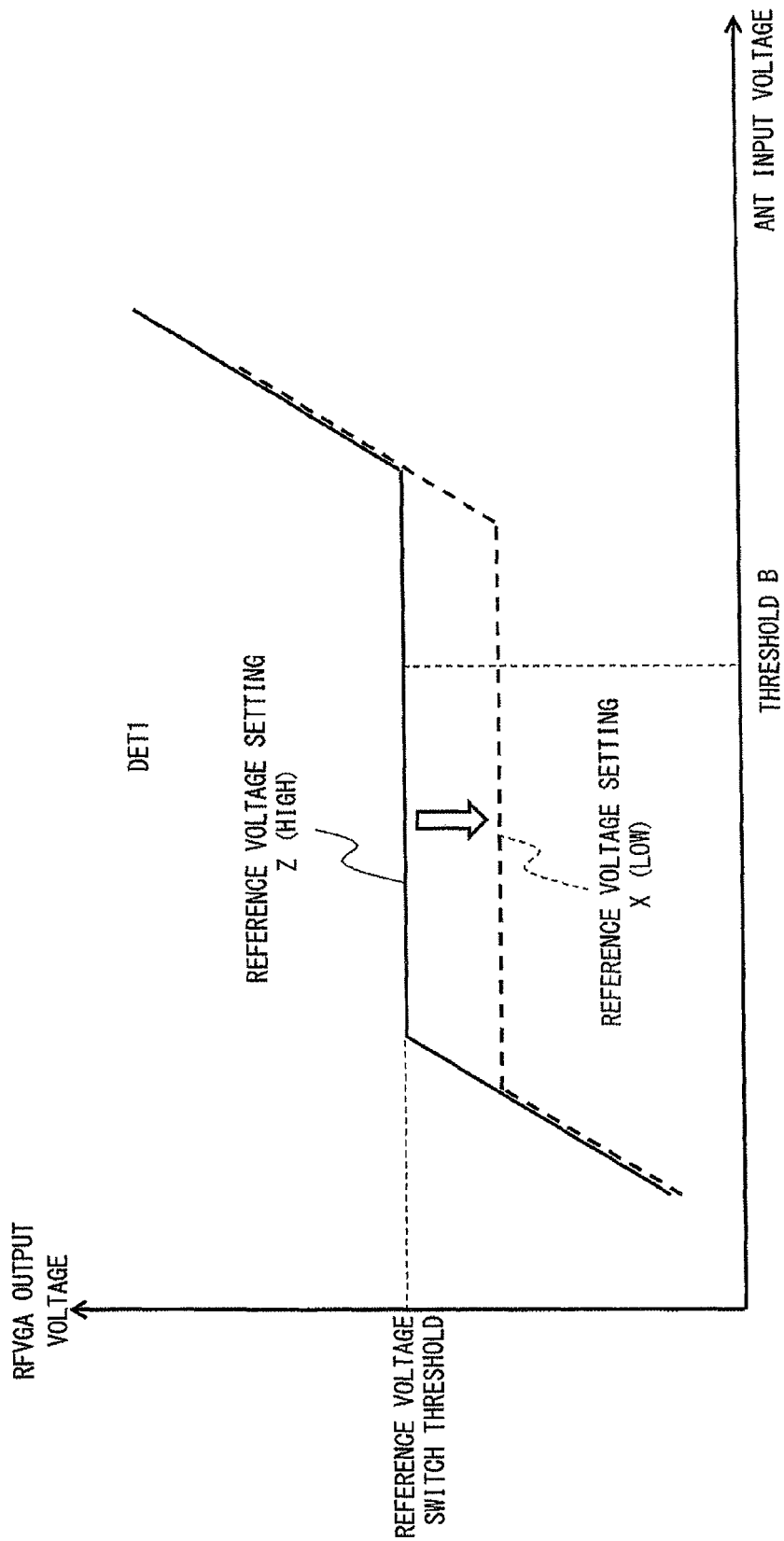
FIG. 8A is a diagram showing a relationship between the output voltage (DET1) from the RFVGA 101 and an ANT input voltage according to the first embodiment.
Figure 8B:
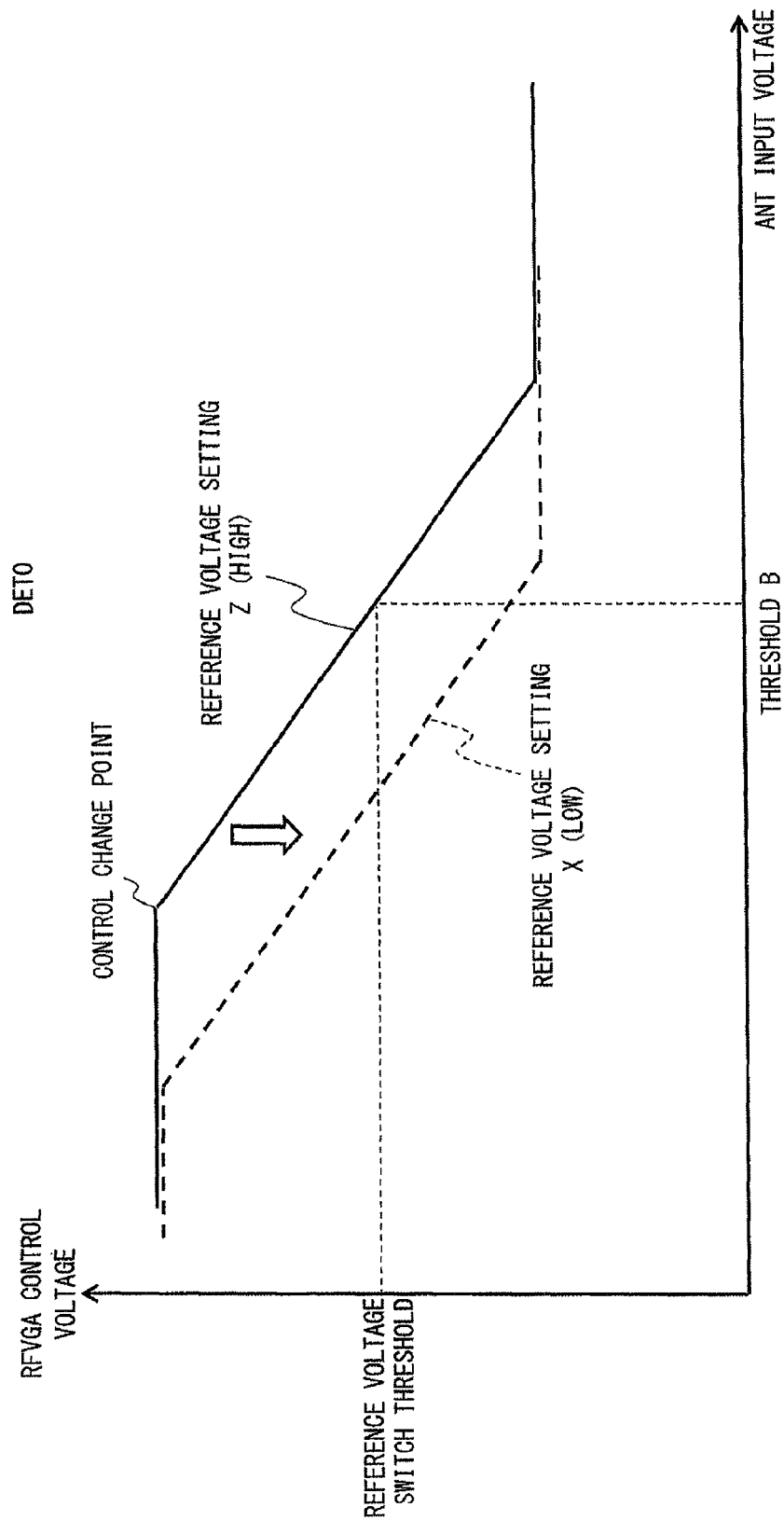
FIG. 8B is a diagram showing a relationship between a voltage of the RFVGA gain control signal and the ANT input voltage according to the first embodiment.
Figure 8C:
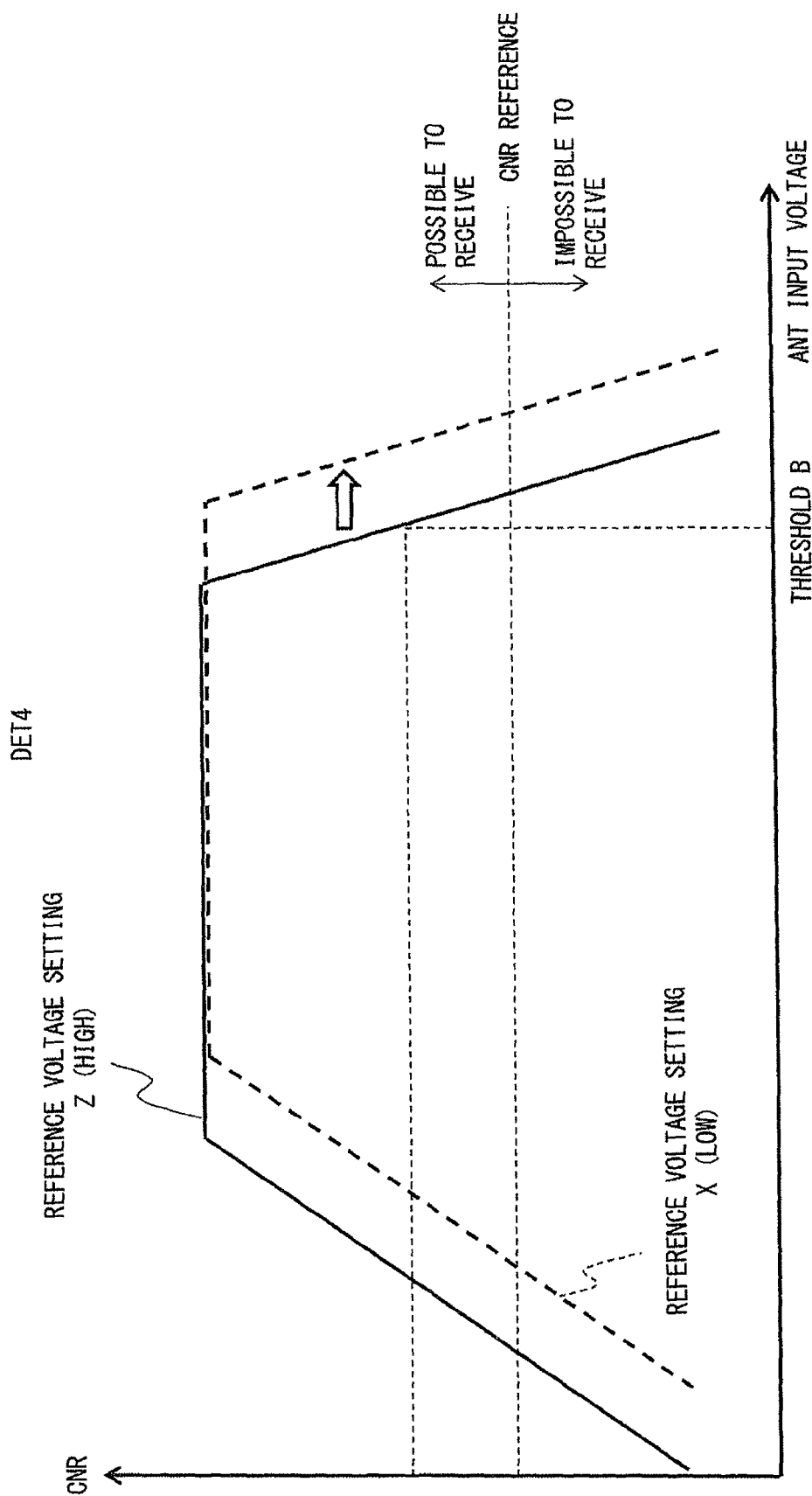
FIG. 8C is a diagram showing a relationship between the CNR (DET4) output from the OFDM demodulator 16 and the ANT input voltage according to the first embodiment.
Figure 8D:
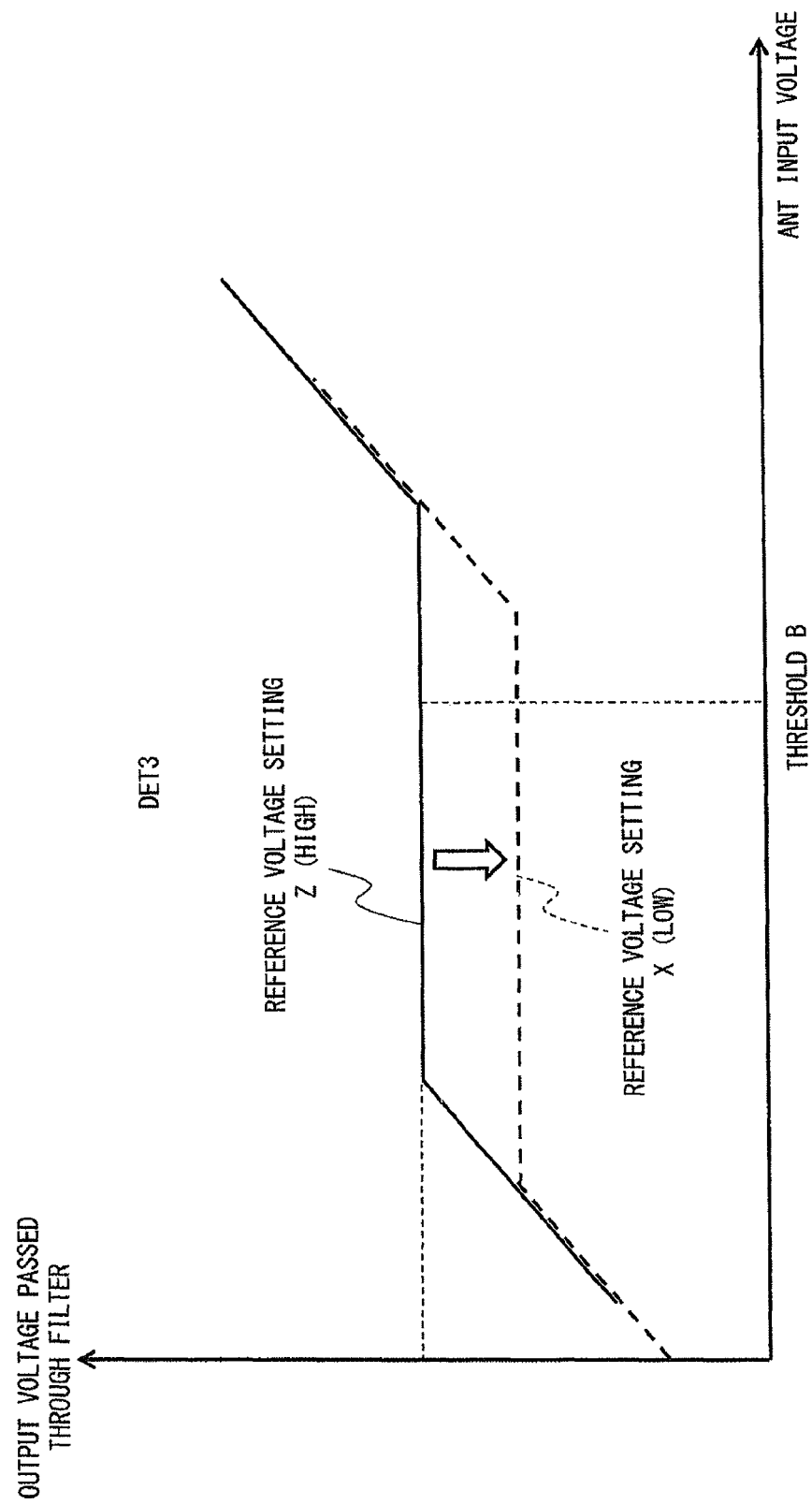
FIG. 8D is a diagram showing a relationship between an output voltage (DET3) from a low-pass filter 12 and the ANT input voltage according to the first embodiment.

The power level evaluation of the desired wave (S105 and S106) by the power detection evaluation circuit 16 shall be explained with reference to FIGS. 8A to 8D. FIG. 8A is a diagram showing a relationship between the convergence voltage (DET1) of the RFVGA 101 and the ANT input voltage (the voltage of the input signal from the antenna ANT and also a total voltage of the interference wave and the desired wave). FIG. 8B is a diagram showing a relationship between the voltage value (DET0) of the RFVGA gain control signal and the ANT input voltage. FIG. 8C is a diagram showing a relationship between the CNR (DET4) that is output from the OFDM demodulator 16 and the ANT input voltage. FIG. 8D is a diagram showing a relationship between the output voltage (DET3) of the low-pass filter 12 and the ANT input voltage. In FIGS. 8A to 8D, the solid lines indicate voltage transitions before the setting of the reference voltage is changed (the reference voltage=Z), while the dotted lines indicate voltage transitions after the setting of the reference voltage is changed (the reference voltage=X).

As shown by the solid line in FIG. 8A, even when the ANT input voltage is increasing, the output voltage from the RFVGA 101 will be constant within the range of gain control by the RFVGA 101 because of the loop control. When the ANT input voltage exceeds the range of gain control by the RFVGA 101, the convergence voltage from the RFVGA 101 increases. Further, as the ANT input voltage increases, the voltage value (DET0) decreases so as to maintain the convergence voltage from the RFVGA 101 to be constant (the solid line in FIG. 8B). This is equivalent to approaching to a minimum value of the possible values for the RFVGA gain control signal.

As described above, when the desired wave has a high voltage level, a side slope (FIG. 3) is generated, and further, when the reference voltage is set to be high (i.e., the reference voltage=Z), the CNR deteriorates at an early stage (the solid line in FIG. 8C).

The power detection evaluation circuit 16 evaluates whether or not the desired wave is greater than or equal to the predetermined level based on the power value (DET0). Specifically, the power detection evaluation circuit 16 evaluates whether or not the power value (DET0) is less than or equal to a reference voltage switch threshold (a second threshold) that corresponds to a threshold B (FIG. 8B). The threshold B may be determined based on a CNR reference value (FIG. 8C).

When the power value (DET0) is less than or equal to the reference voltage switch threshold (the second threshold), the power detection evaluation circuit 16 evaluates whether or not the power value (DET1) is greater than or equal to a reference voltage switch threshold (a third threshold) that corresponds to the threshold B. When the power value (DET1) is greater than or equal to the reference voltage switch threshold, the power detection evaluation circuit 16 evaluates that the power level of the desired wave is high (S106: Yes). If the power value (DET0) or the power value (DET1) do not pass the evaluation, the power detection evaluation circuit 16 evaluates that the power level of the desired wave is low (S106: No).

When the power level of the desired wave is evaluated as being a level for causing a poor reception (S106: Yes), the power detection evaluation circuit 16 switches the reference voltage to X (W<=X<Z). Then, the voltage value (DET1), i.e., the convergence voltage of the RFAGC loop circuit 10, decreases (the dotted line in FIG. 8A). In other words, when the convergence voltage of the RFAGC loop circuit 10 decreases, the point where the voltage of the RFVGA gain control signal starts to change (the RFAGC gain control change point) shifts to a direction in which the ANT input voltage is smaller (the dotted line in FIG. 8B). That is, even when the ANT input voltage is small, the voltage value (DET0) of the RFVGA gain control signal gradually decreases. In other words, the gain of the RFVGA 101 attenuates early. Then, the CNR (DET4) when the ANT input voltage is high improves (the dotted line in FIG. 8C). Specifically, the reception performance improves with an increase in the reception sensitivity possible range (the CNR improves when the ANT input voltage is high as indicated by the dotted line in FIG. 8C).

Note that when the voltage level of the desired wave is high, the voltage value (DET3) of the output signal from the low-pass filter 12 is calculated by adding the gains of the frequency converter 11 and the low-pass filter 12 to the voltage value (DET1) of the output signal from the RFVGA 101. That is, when the voltage level of the desired wave is high, there is a correlation between the voltage value (DET1) of the output signal from the RFVGA 101 and the voltage value (DET3) of the output signal from the low-pass filter 12. FIG. 8D is a diagram showing a relationship between the output voltage value (DET3) from the low-pass filter 12 and the ANT input voltage. As the low-pass filter 12 performs filtering, the output voltage (DET3) of the low-pass filter 12 and the voltage value (DET1) of the output signal from the RFVGA 101 will have almost the same voltage change with respect to the ANT input voltage (that is, the shape of the solid line in FIG. 8A will be almost the same as the shape of the solid line in FIG. 8D). Thus, the power detection evaluation circuit 16 may use the voltage value (DET3) in place of the voltage value (DET1) so as to evaluate whether or not the voltage value (DET3) is greater than or equal to a reference voltage switch threshold (a fourth threshold).

Further, in the above explanation, although the power detection evaluation circuit 16 evaluates the power level of the desired wave using the power value (DET0) and the power value (DET1) (or (DET3)), it is not limited to this. That is, although the evaluation accuracy will become low, the power detection evaluation circuit 16 may evaluate the power level of the desired wave using only the power value (DET0).

Referring back to FIG. 5, when the adjacent channel interference wave is not detected (S103: No) and the power level of the desired wave is not greater than or equal to the certain value (S106: No), the power detection evaluation circuit 16 detects the intermodulation distortion by a plurality of interference waves (S108). The detection (S108) is performed to handle the case, as shown in FIG. 2, in which the channels are disposed at an equal interval and the reception performance deteriorates due to the intermodulation distortion. When the case shown in FIG. 2 is detected (S109: Yes), the power detection evaluation circuit 16 outputs the reference voltage control signal so that the reference voltage=Y (W<=X<=Y<Z) (S110). When the case shown in FIG. 2 is not detected (S109: No), the power detection evaluation circuit 16 leaves the reference voltage as the initial value (the reference voltage=Z). Then, the power detection evaluation circuit 16 performs the processing from the detection processing of the adjacent channel interference wave (S102) again.

Figure 9B:
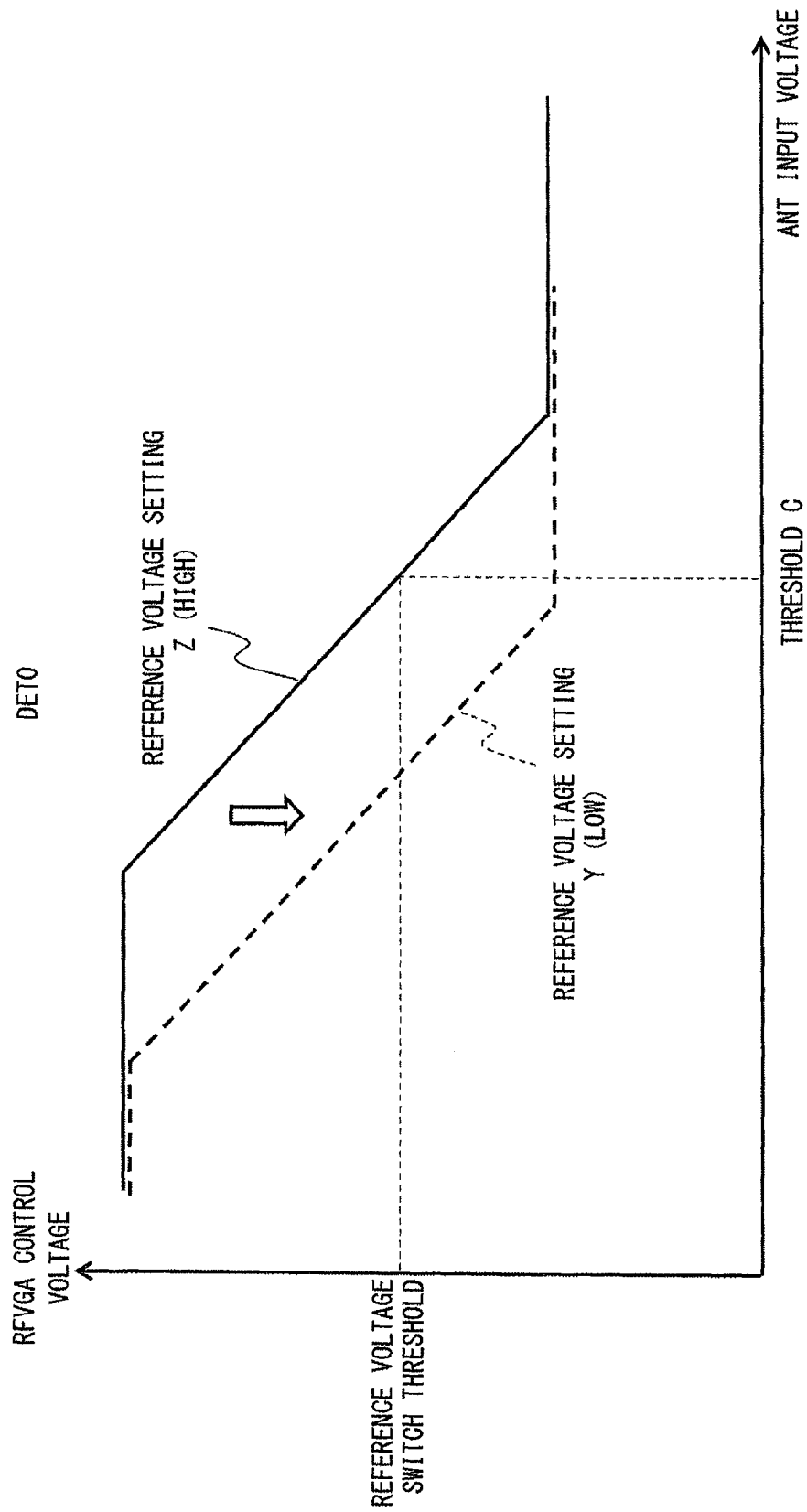
FIG. 9B is a diagram showing a relationship between the voltage value (DET0) and the ANT input voltage according to the first embodiment.
Figure 9C:
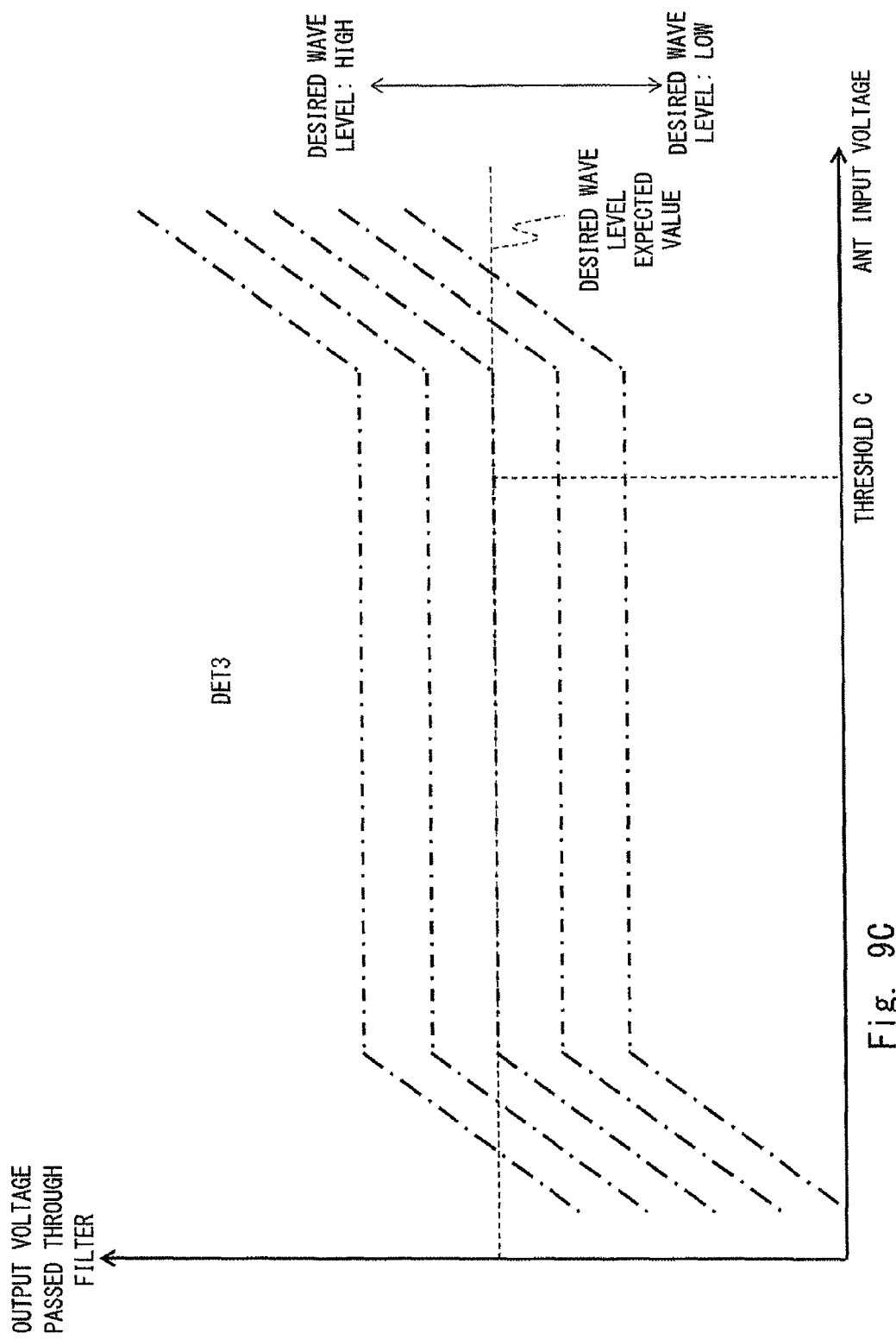
FIG. 9C is a diagram showing a relationship between the voltage value (DET3) of an output signal from the low-pass filter 12 and a power level of a desired wave according to the first embodiment.
Figure 9D:
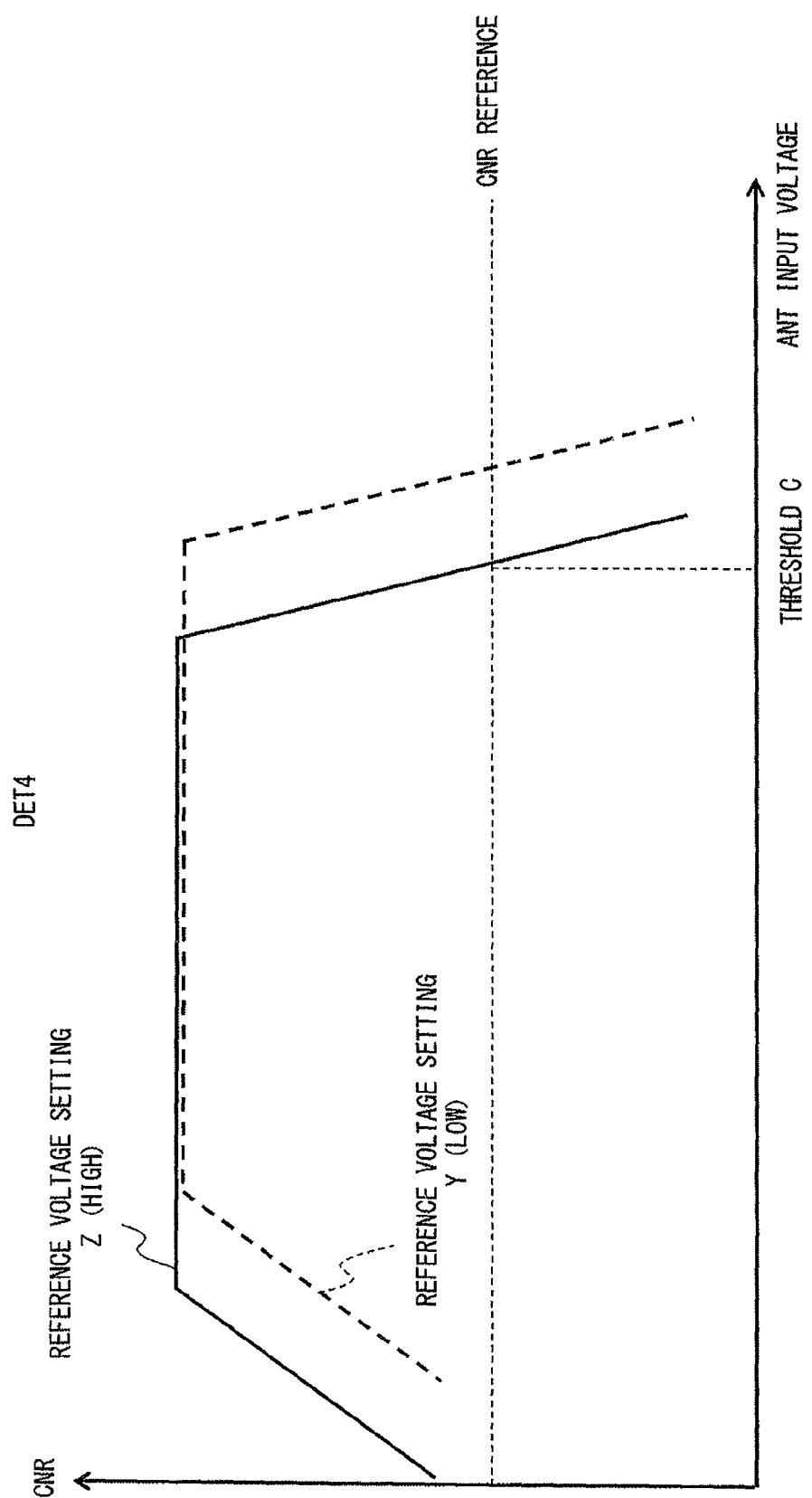
FIG. 9D is a diagram showing a relationship between the ANT input voltage and the CNR according to the first embodiment.

Details of the detection and evaluation (S108 and S109) of the intermodulation distortion by the plurality of interference waves performed by the power detection evaluation circuit 16 shall be explained. The detection/evaluation processing is performed in three steps. An outline of the detection/evaluation processing is as follows. When the ANT input voltage is large, the voltage level of the desired wave is small, and the CNR is less than or equal to the reference value, total power of the interference wave other than the desired wave is evaluated as being large, thereby evaluating that the case shown in FIG. 2 could be generated. Hereinafter, details of the detection/evaluation processing shall be explained with reference to FIGS. 9A to 9D and a flowchart of FIG. 10. In FIGS. 9A, 9B, and 9D, the solid lines indicate voltage transitions before the setting of the reference voltage is changed (the reference voltage=Z), while the dotted lines indicate voltage transitions after the setting of the reference voltage is changed (the reference voltage=Y).

In a first step, the power detection evaluation circuit 16 evaluates whether or not the ANT input voltage that is input to the RVFGA 101 is greater than or equal to a certain value. The evaluation is performed using at least one of the voltage value (DET0) and the voltage value (DET1). Firstly, a case in which the evaluation is performed using the voltage value (DET1) shall be explained. FIG. 9A is a diagram showing a relationship between the output voltage value (DET1) from the RFVGA 101 and the ANT input voltage. The output voltage value (DET1) from the RFVGA 101 increases with the increase in the ANT input voltage, then stays at a certain value by the gain control, and increases again when the ANT input voltage that exceeds the range of gain control by the RFVGA 101 is input. The power detection evaluation circuit 16 determines a threshold C of the ANT input voltage and evaluates whether or not the power value (DET1) is greater than or equal to a reference voltage switch threshold (a fifth threshold) that corresponds to the threshold C. The power value (DET1) is greater than or equal to the reference voltage switch threshold, the power detection evaluation circuit 16 evaluates that the ANT input voltage is greater than a predetermined level (FIG. 10, S1081: Yes).

Next, the evaluation of the ANT input voltage using the voltage value (DET0) shall be explained. FIG. 9B is a diagram showing a relationship between the voltage value (DET0) and the ANT input voltage. As shown by the solid line in FIG. 9B, the voltage value (DET0) decreases with an increase in the ANT input voltage. Then, the power detection evaluation circuit 16 evaluates whether or not the power value (DET0) is less than or equal to a reference voltage switch threshold (a sixth threshold) that corresponds to the threshold C. When the power value (DET0) is less than or equal to the reference voltage switch threshold, the power detection evaluation circuit 16 evaluates that the ANT input voltage as being high (FIG. 10, S1081: Yes).

Note that the power detection evaluation circuit 16 may evaluate that the input voltage is greater than or equal to the certain value when both evaluations using the voltage value (DET0) and the voltage value (DET1) are passed. By performing both evaluations, the evaluation can be more accurate.

Figure 10:
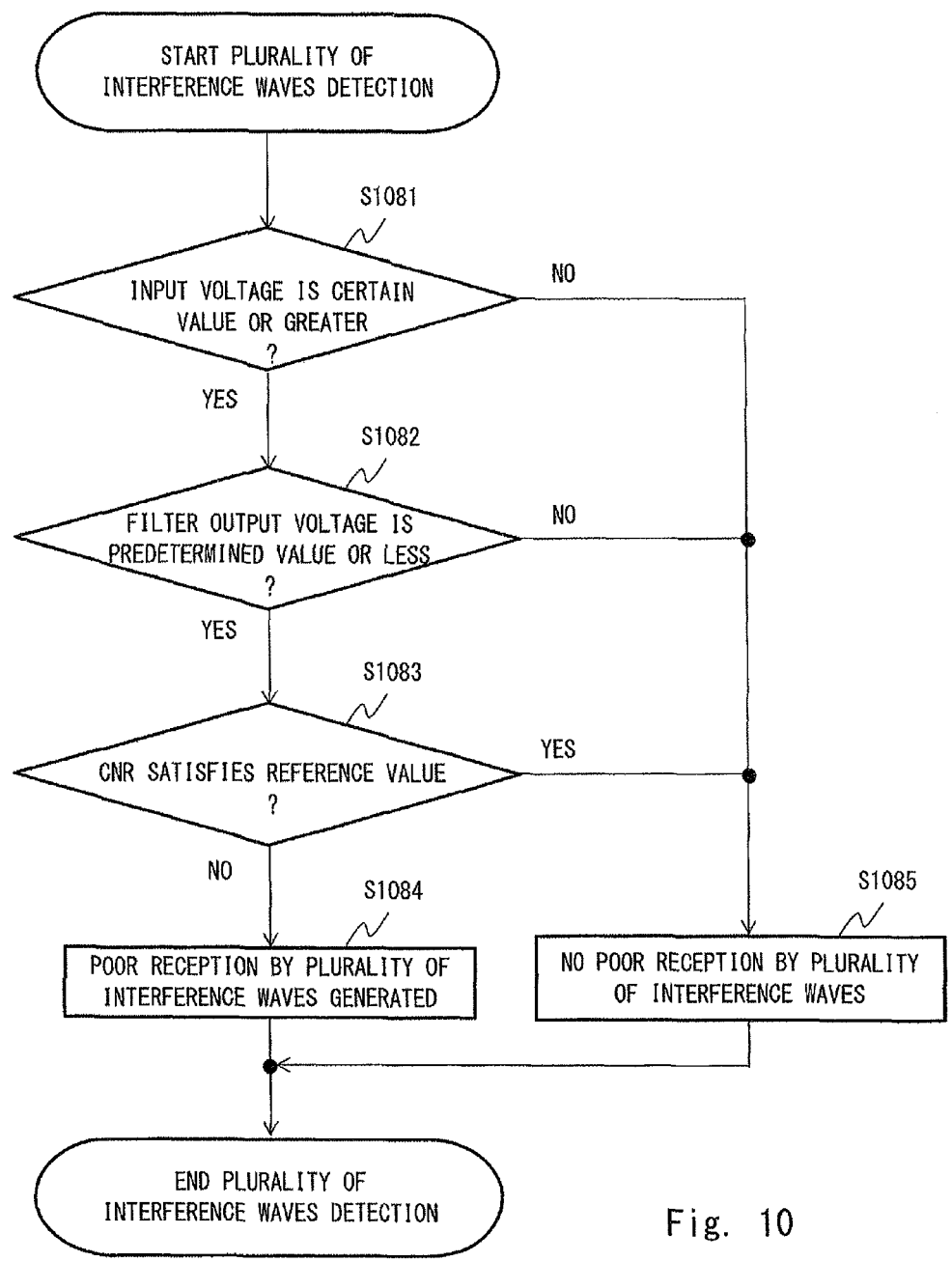
FIG. 10 is a flowchart showing a flow of processing by the power detection evaluation circuit 16 according to the first embodiment.

When the ANT input voltage is greater than or equal to the certain value (FIG. 10, S1081: Yes), the power detection evaluation circuit 16 evaluates whether or not the voltage value (DET3) of the output signal from the low-pass filter 12 is less than or equal to a predetermined threshold (a seventh threshold) (S1082). FIG. 9C is a diagram showing a relationship between the power level of the desired wave and the voltage value (DET3) of the output signal from the low-pass filter 12. FIG. 9C shows a voltage change of the power level of the desired wave in five stages. As shown in FIG. 9C, when the power level of the desired wave is high, the output voltage value (DET3) from the low-pass filter 12 will become entirely high, while when the power level of the desired wave is low, the output voltage value (DET3) from the low-pass filter 12 will become entirely low. Then, the power detection evaluation circuit 16 compares an expected value of the desired wave with the output voltage value from the low-pass filter 12 so as to evaluate whether or not the power level of the desired wave is high (FIG. 10, S1082).

When the power level of the desired wave is low (FIG. 10, S1082: Yes), the power detection evaluation circuit 16 estimates that a total power level of the interference wave is high, together with the evaluation in S1081 in FIG. 10, and performs the evaluation on the CNR (FIG. 10, S1083). When the power level of the desired wave (i.e., the voltage value (DET3)) is high (FIG. 10, S1082: No), the power detection evaluation circuit 16 evaluates that there is no poor reception by the plurality of interference waves (FIG. 10, S1085).

When the ANT input voltage is high (FIG. 10, S1081: Yes), and the power level of the desired wave is less than or equal to the certain value (FIG. 10, S1082: Yes), the power detection evaluation circuit 16 evaluates whether or not the CNR satisfies a quality reference value (FIG. 10, S1083). FIG. 9D is a diagram showing a relationship between the ANT input voltage and the CNR. As shown in FIG. 9D, when the ANT input voltage exceeds the certain value, the CNR will gradually decrease. The power detection evaluation circuit 16 evaluates whether or not the voltage value (DET4) satisfies the quality reference value (FIG. 10, S1083).

When the CNR (DET4) satisfies the quality reference value (FIG. 10, S1083: Yes), the power detection evaluation circuit 16 evaluates that there is no poor reception by the plurality of interference waves (FIG. 10, S1085). When the CNR (DET4) does not satisfy the quality reference value (FIG. 10, S1083: No), the power detection evaluation circuit 16 evaluates that there is a poor reception by the plurality of interference waves (FIG. 10, S1084). When the power detection evaluation circuit 16 evaluates that there is a poor reception by the plurality of interference waves (FIG. 10, S1084), the power detection evaluation circuit 16 changes the setting so that the reference voltage=Y (W<=X<=Y<Z). Meanwhile, when the power detection evaluation circuit 16 evaluates that there is no poor reception by the plurality of interference waves (FIG. 10, S1085), the power detection evaluation circuit 16 leaves the reference voltage as the initial value X.

By reducing the reference voltage (the reference voltage=Y), the value of the output voltage from the RFVGA 101 decreases (the dotted line in FIG. 9A). In response, the point where the voltage of the RFVGA gain control signal starts to change (the RFAGC gain control change point) transitions to a direction in which the ANT input voltage is smaller (the dotted line in FIG. 9B). In other words, the gain of the RFVGA 101 attenuates early. Accordingly, the CNR (DET4) when the ANT input voltage is high improves (the dotted line in FIG. 9D). Specifically, the reception performance improves with an increase in the reception sensitivity possible range (the CNR improves when the ANT input voltage is high as indicated by the dotted line in FIG. 9D).

Note that even when the above-mentioned evaluation on the CNR (FIG. 10, S1083) is not performed, the power detection evaluation circuit 16 can detect that a total voltage level of the plurality of interference waves is high. Thus, the power detection evaluation circuit 16 can set the reference voltage without performing the evaluation on the CNR (FIG. 10, S1083). However, by performing the evaluation on the CNR (FIG. 10, S1083), it is possible to accurately understand that the desired wave is influenced by the interference waves that are disposed at an equal interval, thereby enabling more accurate setting of the reference voltage.

The receiver 1 detects a plurality of kinds of the poor reception causes according to the above-described flow shown in FIG. 5 and controls the reference voltage (which is eventually the RFVGA control voltage for controlling the RFVGA 101) according to the detected poor reception cause.

Next, effects of the receiver 1 according to this embodiment shall be explained. As described above, the receiver 1 refers to the voltage values (DET0 to DET4) so as to perform the evaluation processing on the plurality of kinds of poor reception states (the adjacent channel interference wave exists at a strong level, the reception level of the desired wave is high, and the intermodulation distortion by the plurality of interference waves exists). As the evaluation is performed on the plurality of kinds of poor reception states, the receiver 1 can perform the accurate gain control according to the evaluated reception state. By performing the accurate gain control, the receiver 1 can achieve sufficient interference wave tolerance.

Specifically, the receiver 1 controls the reference voltage according to the flow shown in FIG. 5. When the reception level of the adjacent channel interference wave is large, the power detection evaluation circuit 16 immediately changes the reference voltage without performing other evaluations. The CNR is not used for the evaluation on the reception level of the adjacent channel interference wave. That is, the receiver 1 can switch the reference voltage before the reception signal, which is an analog signal, is demodulated to a digital signal. Therefore, the receiver 1 can immediately recover from the poor reception state.

Further, the power detection evaluation circuit 16 uses the CNR (the voltage value (DET4)) so as to perform the level evaluation of the desired wave and the evaluation of the intermodulation distortion by the plurality of interference waves. The power detection evaluation circuit 16 can perform an accurate evaluation in consideration of actual reception quality by using the CNR.

The power detection evaluation circuit 16 changes the reference voltage according to the detected poor reception state (the above-mentioned W, X, Y, Z). Therefore, the power detection evaluation circuit 16 can perform specific control according to the reception state.

Second Embodiment

Next, a configuration and an operation of a receiver 1 according to a second embodiment shall be explained. The power detection evaluation circuit 16 according to this embodiment performs level evaluation of the desired wave (FIG. 5, S105 and S106) and detection of intermodulation distortion by a plurality of interference waves (FIG. 5, S108 and S109) in a procedure different from the procedure in the first embodiment. Hereinafter, differences from the first embodiment shall be mainly explained.

Figure 11:
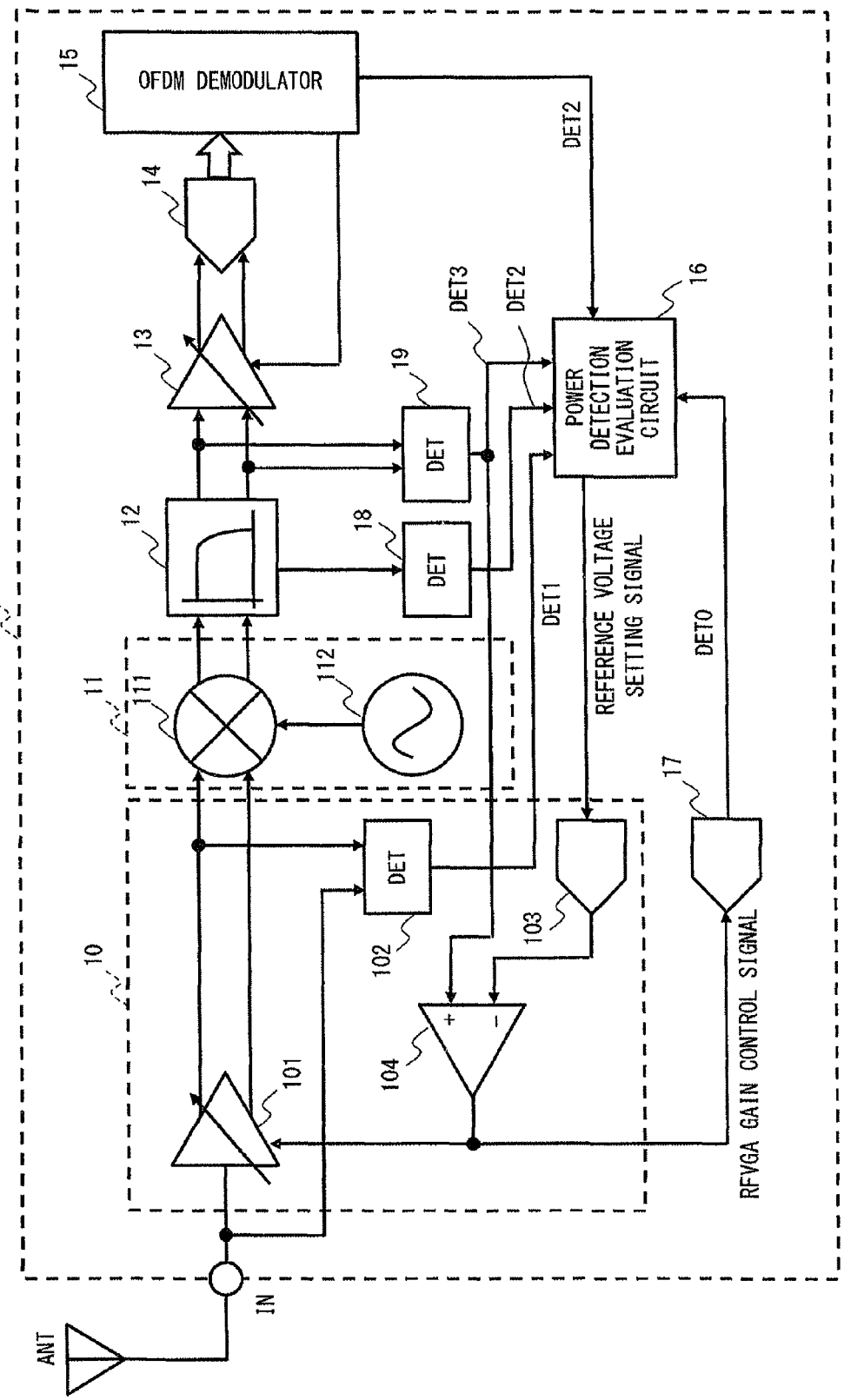
FIG. 11 is a block diagram showing a configuration of the receiver 1 according to the first embodiment.

FIG. 11 is a block diagram showing a configuration of the receiver 1 according to this embodiment. Each of circuits constituting the receiver 1 according to this embodiment has the same configuration as the configuration shown in FIG. 4, but an input/output relationship is slightly different from the one shown in FIG. 4. The input signal from the antenna ANT instead of the output signal from the RFVGA 101 is supplied to the power detector 102. Therefore, in this embodiment, the voltage value (DET1) is the voltage value of the input signal from the antenna ANT. Further, a signal output from the DAC 103 and an output signal from the power detector 19 are supplied to the differential amplifier 104. As the output signal from the low-pass filter 12 is a filtered signal, the output signal can be substantially regarded as the component of only the desired wave. Thus, the receiver 1 controls the RFAGC loop circuit 10 based on the voltage value (DET3) of the output signal from the low-pass filter 12.

Figure 12A:
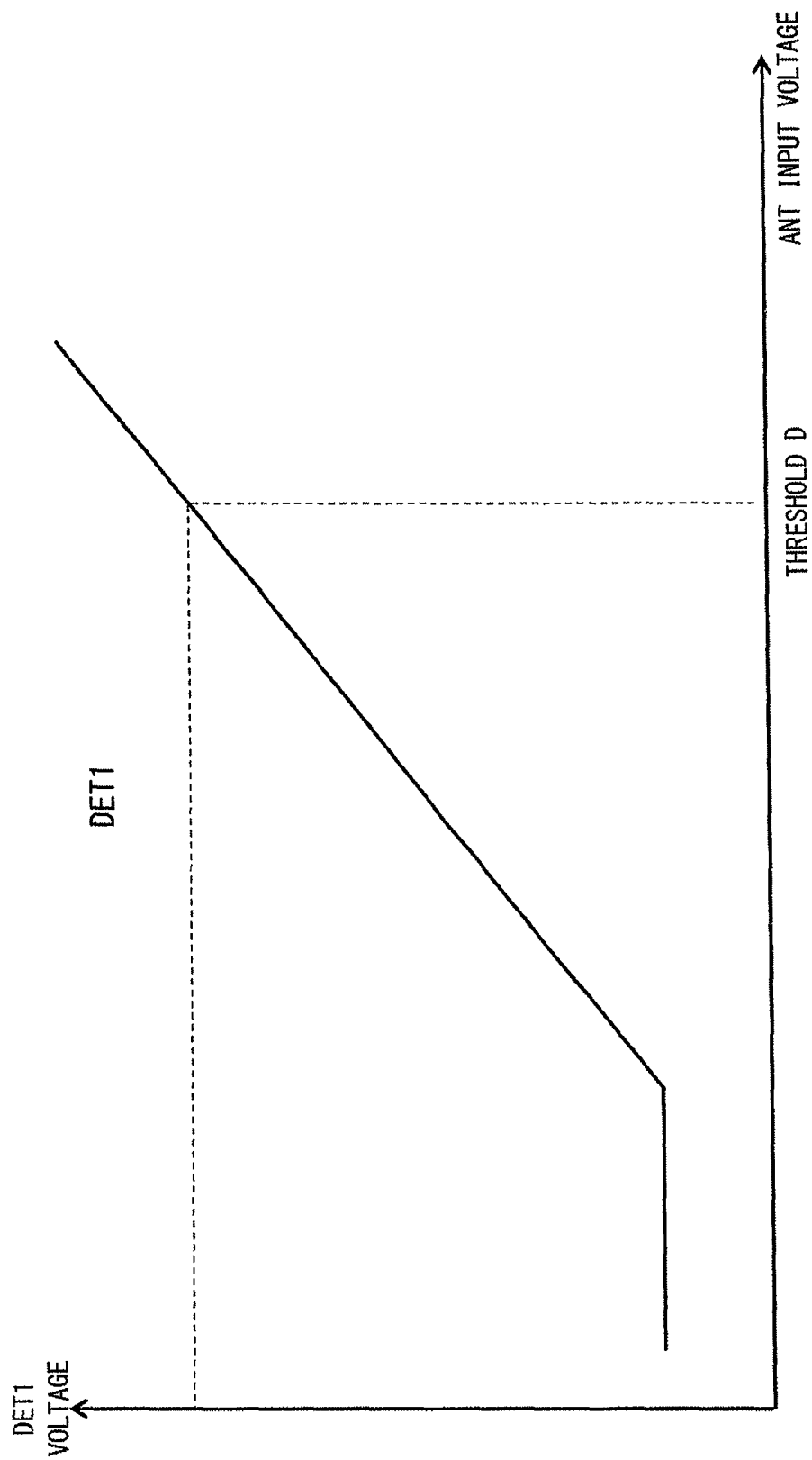
FIG. 12A is a diagram showing a relationship between the ANT input voltage and the voltage value (DET1) according to a second embodiment.
Figure 12B:
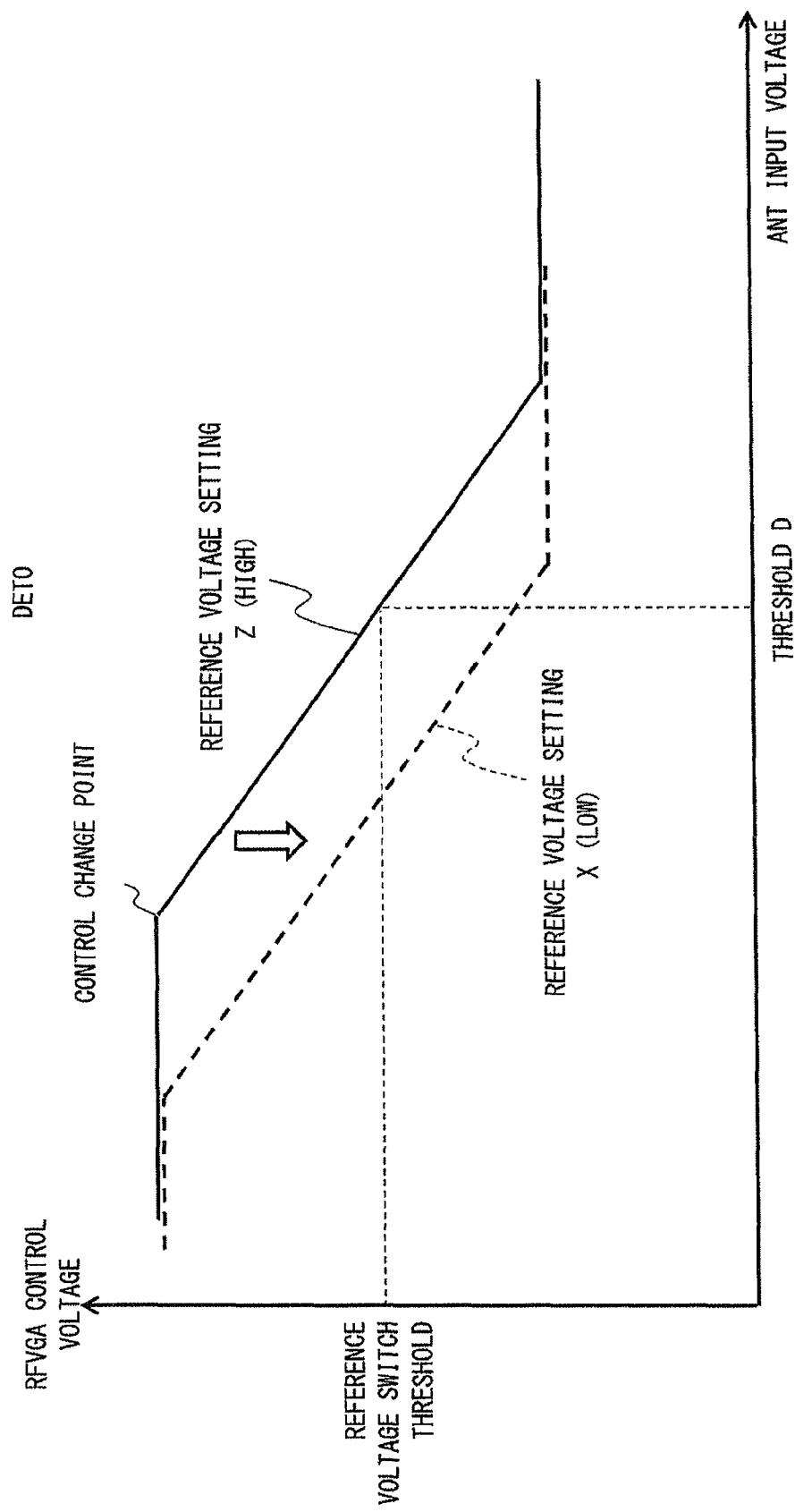
FIG. 12B is a diagram showing a relationship between the voltage value (DET0) and the ANT input voltage according to the second embodiment.
Figure 12C:
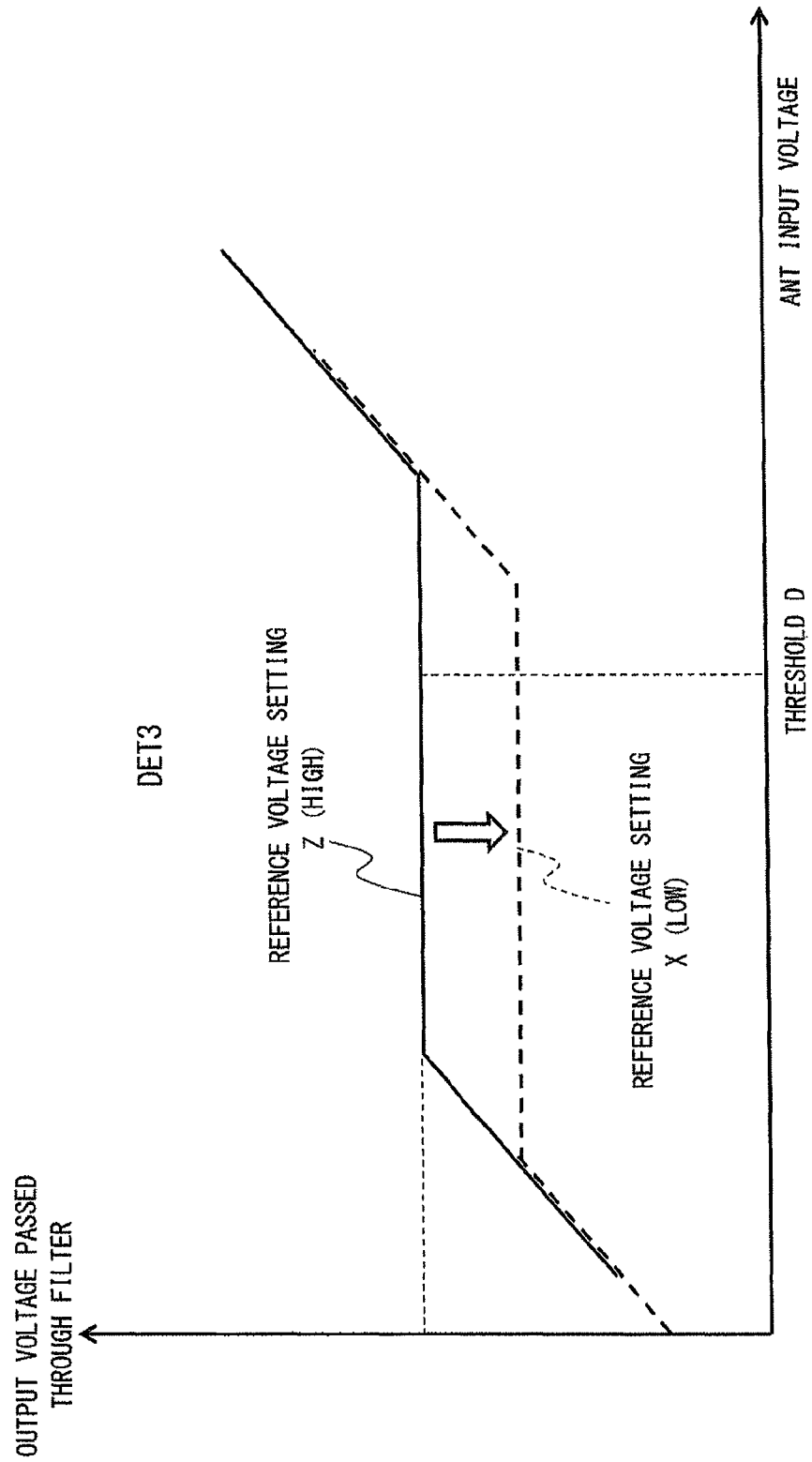
FIG. 12C is a diagram showing a relationship between the ANT input voltage and the output voltage value (DET3) from the low-pass filter 12 according to the second embodiment.
Figure 12D:
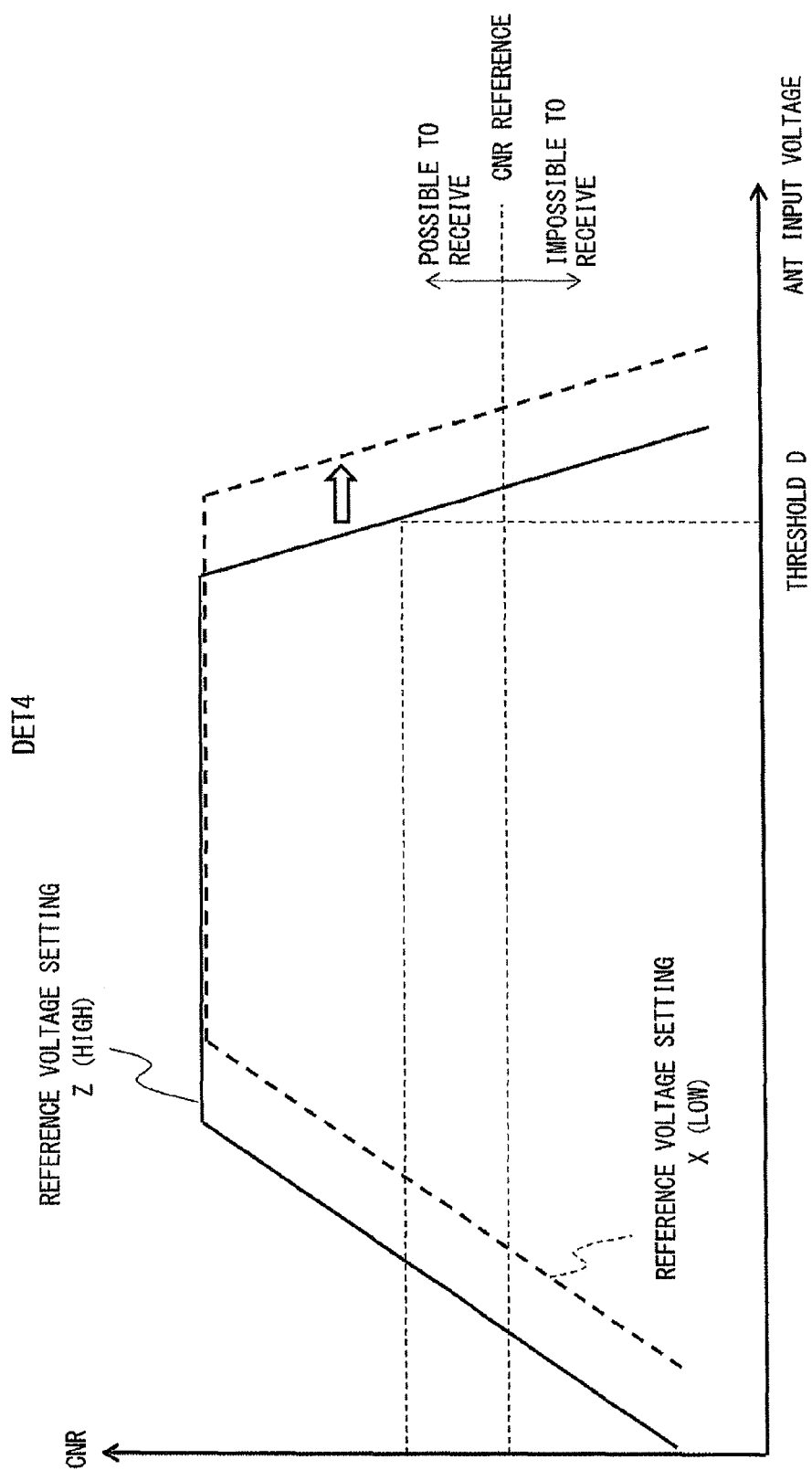
FIG. 12D is a diagram showing a relationship between the CNR (DET4) and the ANT input voltage according to the second embodiment.
Figure 13:
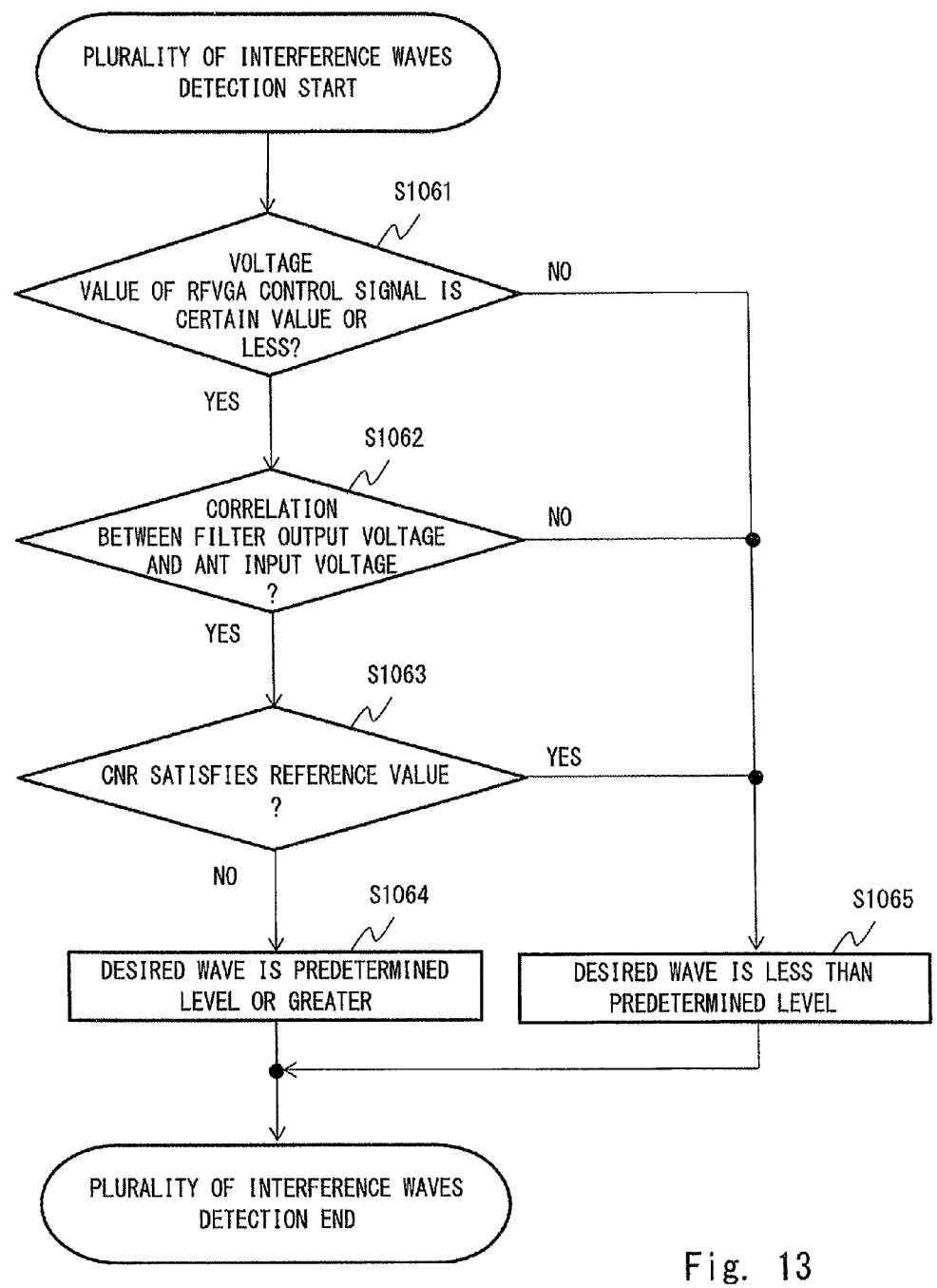
FIG. 13 is a flowchart showing a flow of processing by the power detection evaluation circuit 16 according to the second embodiment.

Next, the level evaluation of the desired wave (FIG. 5, S105 and S106) according to this embodiment shall be explained with reference to FIGS. 12A to 12D and a flowchart of FIG. 13. In FIG. 12A to 12D, the solid lines indicate voltage transitions before the setting of the reference voltage is changed (the reference voltage=Z), while the dotted lines indicate voltage transitions after the setting of the reference voltage is changed (the reference voltage=X). FIG. 13 is a flowchart showing a specific flow of the level evaluation of the desired wave (S106) according to this embodiment. Note that as the entire flow of processing of the power detection evaluation circuit 16 is the same as the flow shown in FIG. 5, a detailed explanation regarding the flow of processing shall be omitted.

As a premise for the level evaluation of the desired wave, the power level of the adjacent channel interference wave is evaluated as being low in S104. Therefore, when the voltage value (DET0) of the RFVGA gain control signal is small, the power level of the desired wave is assumed to be high. Thus, the power detection evaluation circuit 16 compares the reference voltage switch threshold corresponding to the threshold D that is determined based on the quality reference value of the CNR with the voltage value (DET0). FIG. 12B is a diagram showing a relationship between the voltage value (DET0) and the ANT input voltage. As shown in FIG. 12B, the voltage value (DET0) decreases with an increase in the ANT input voltage. Thus, the power detection evaluation circuit 16 evaluates whether or not the voltage value (DET0) is less than or equal to the reference voltage switch threshold (FIG. 13, S1061). When the voltage value (DET0) is not less than or equal to the reference voltage switch threshold (FIG. 13, S1061: No), the power detection evaluation circuit 16 evaluates that the desired wave has not reached the predetermined level (FIG. 13, S1065).

When the voltage value (DET0) is less than or equal to the reference voltage switch threshold (FIG. 13, S1061: Yes), the power detection evaluation circuit 16 evaluates whether or not there is a correlation between the voltage value (DET1) and the voltage value (DET3) (S1062). FIG. 12A is a diagram showing a relationship between the ANT input voltage and the voltage value (DET1). FIG. 12C is a diagram showing a relationship between the ANT input voltage and the output voltage value (DET3) from the low-pass filter 12. When the ANT input voltage exceeds the range of gain control by the RFVGA 101, the voltage value (DET3) increases in proportion to the increase in the ANT input voltage (FIG. 12C). As a premise, the power level of the adjacent channel interference wave is evaluated as being low, when there is a correlation between the voltage value (DET1) of the input signal from the antenna ANT and the voltage (DET3) of the output signal from the low-pass filter 12, the power level of the desired wave is expected to be high. Therefore, the power detection evaluation circuit 16 evaluates whether or not there is a correlation between the voltage value (DET1) and the voltage value (DET3). When there is no correlation between the voltage value (DET1) and the voltage value (DET3) (FIG. 13, S1062: No), the power detection evaluation circuit 16 evaluates that the desired wave has not reached the predetermined level (FIG. 13, S1065).

When there is a correlation between the voltage value (DET1) and the voltage value (DET3) (FIG. 13, S1062: Yes), the power detection evaluation circuit 16 evaluates whether or not the CNR (DET4) satisfies the quality reference value (FIG. 13, S1063). FIG. 12D is a diagram showing a relationship between the CNR (DET4) and the ANT input voltage. When the CNR (DET4) satisfies the quality reference value (FIG. 13, S1063: Yes), the power detection evaluation circuit 16 evaluates that the power level of the desired wave has not reached the predetermined level (FIG. 13, S1065). Meanwhile, when the CNR (DET4) does not satisfy the quality reference value (FIG. 13, S1063: No), the power detection evaluation circuit 16 evaluates that the power level of the desired wave has reached the predetermined level (FIG. 13, S1064).

When the power detection evaluation circuit 16 evaluates that the power level of the desired wave as being the level which causes a poor reception (FIG. 13, S1064), the power detection evaluation circuit 16 switches the reference voltage to X (W<=X<Z). When the reference voltage decreases, the point where the voltage of the RFVGA gain control signal starts to change (the RFAGC gain control change point) shifts to a direction in which the ANT input voltage is smaller (the dotted line in FIG. 12B). That is, the gain of the RFVGA 101 attenuates early. Accordingly, the CNR (DET4) when the ANT input voltage is high improves (the dotted line in FIG. 12D). Specifically, the reception performance improves with an increase in the reception sensitivity possible range (the CNR improves when the ANT input voltage is high as indicated by the dotted line in FIG. 12D).

Note that in FIG. 13, although the power detection evaluation circuit 16 evaluates that the power level of the desired wave as being high when all of the evaluations in S1061 to S1063 are passed, it is not necessarily limited to this. The power detection evaluation circuit 16 may perform the level evaluation of the desired wave by performing at least one of the processing in S1061 and S1062 in FIG. 13. However, by performing the evaluations in S1061 to S1063 in FIG. 13, the power level of the desired wave can be accurately evaluated.

Next, the detection and the evaluation (S108 and S109 in FIG. 5) of the intermodulation distortion by the plurality of interference waves according to this embodiment shall be explained with reference to FIGS. 14A to 14D and a flowchart of FIG. 10. The flow of the processing is same as the one in the first embodiment (same as the one shown in FIG. 10). As a premise for the evaluation, the power level of the adjacent ch interference wave is evaluated as being low (S103: No), and the power level of the desired wave is evaluated as being low (S106: No). The detection/evaluation processing is performed in three steps in a manner similar to the first embodiment. An outline of the detection/evaluation processing is as follows. When the ANT input voltage (the total voltage of signals input from the antenna ANT) is large, the voltage level of the desired wave is small, and the CNR is less than or equal to the quality reference value, total power of the interference wave other than the desired wave is evaluated as being large, thereby evaluating that the case shown in FIG. 2 could be generated.

Figure 14A:
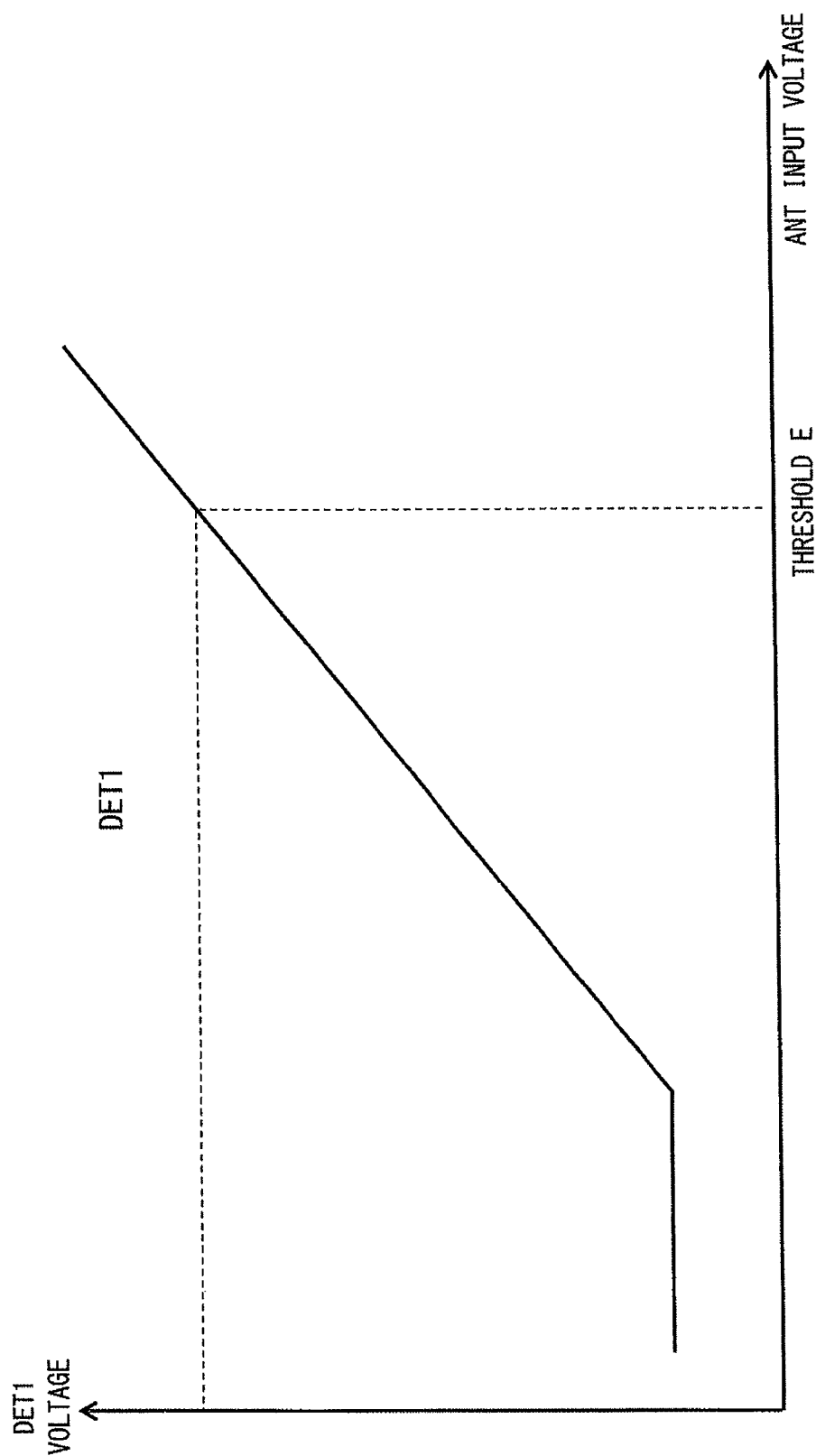
FIG. 14A is a diagram showing a relationship between the ANT input voltage and the voltage value (DET1) according to the second embodiment.

In a first step, the power detection evaluation circuit 16 evaluates whether or not the voltage value (DET1) is greater than or equal to a certain value. The voltage value (DET1) simply increases in proportion to the ANT input voltage. FIG. 14A is a diagram showing a relationship between the ANT input voltage and the voltage value (DET1). The power detection evaluation circuit 16 determines a threshold E of the ANT input voltage and evaluates whether or not the power value (DET1) is greater than or equal to a reference voltage switch threshold (an eighth threshold) that corresponds to the threshold E. When the power value (DET1) is greater than or equal to the reference voltage switch threshold, the power detection evaluation circuit 16 evaluates that the ANT input voltage is greater than a predetermined level (FIG. 10, S1081: Yes).

Figure 14B:
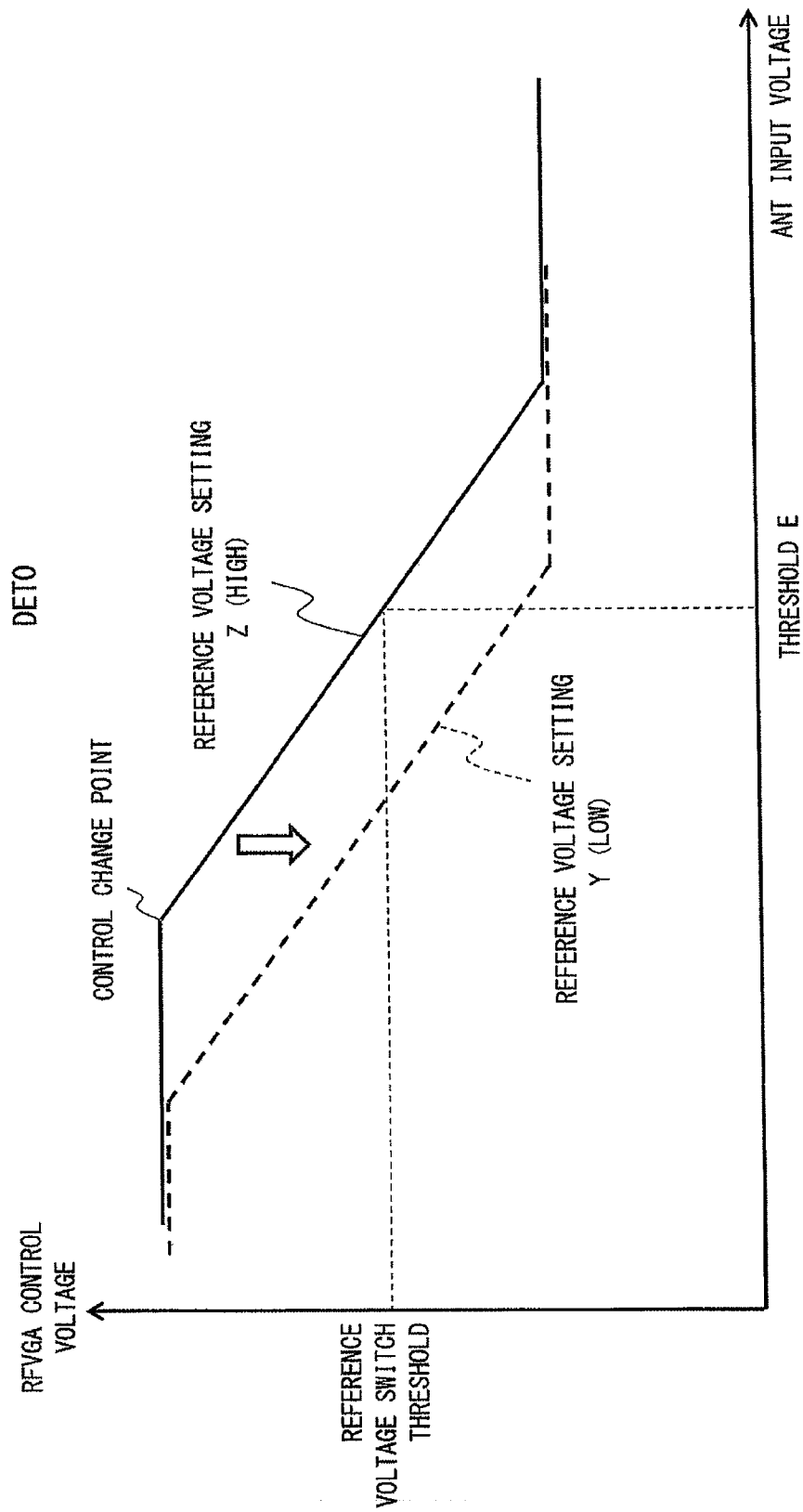
FIG. 14B is a diagram showing a relationship between the ANT input voltage and the voltage value (DET0) according to the second embodiment.

Further, the evaluation on the ANT input voltage may be performed using the voltage value (DET0) in a manner similar to the first embodiment. FIG. 14B is a diagram showing a relationship between the ANT input voltage and the voltage value (DET0). As the evaluation method is same as the one explained in the first embodiment, a detailed explanation of the evaluation method shall be omitted.

Figure 14C:
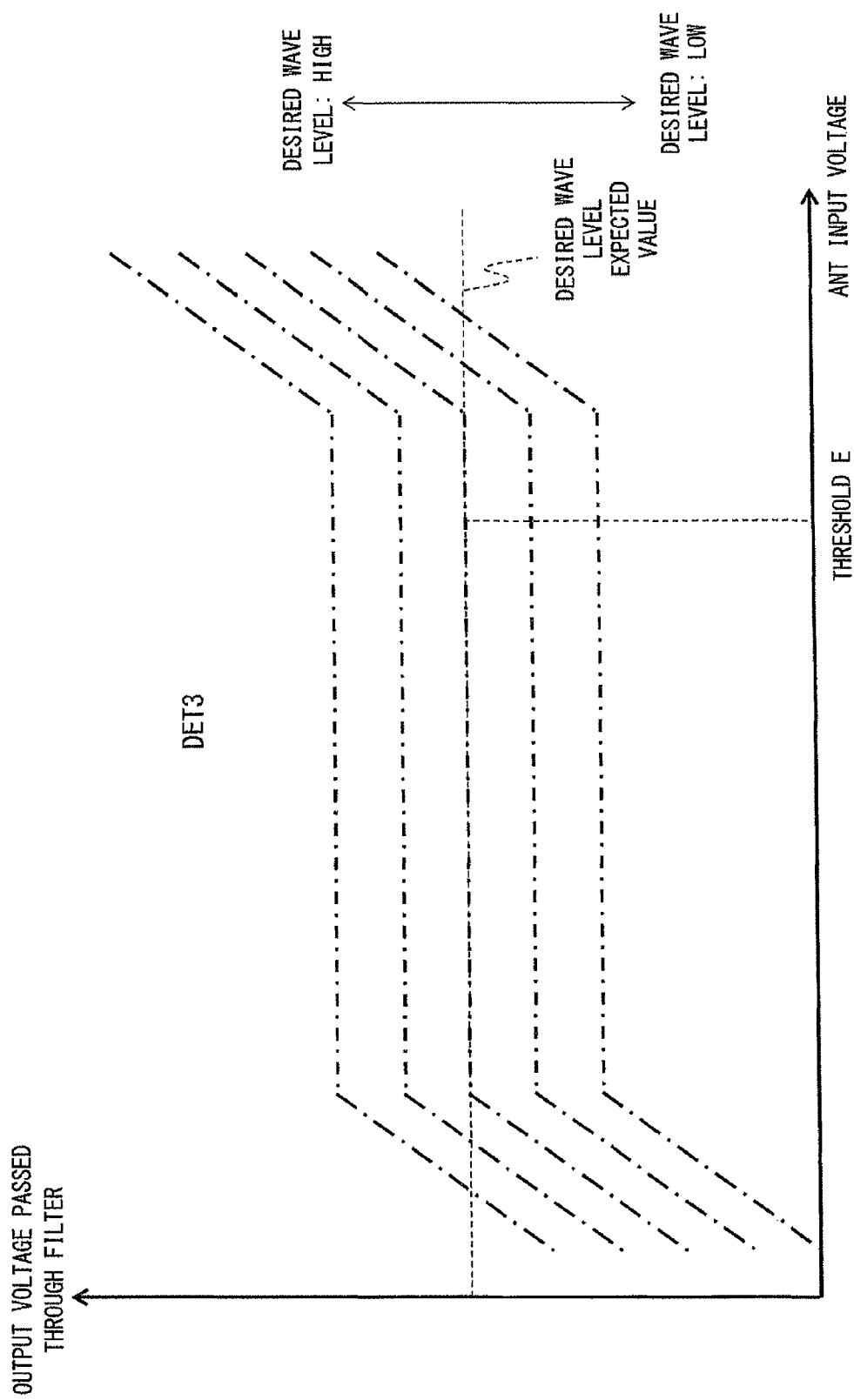
FIG. 14C is a diagram showing a relationship between a power level of a desired wave and the voltage value (DET3) of the output signal from the low-pass filter 12 according to the second embodiment.

When the voltage value (DET1) is greater than or equal to the certain value (FIG. 10, S1081: Yes), the power detection evaluation circuit 16 evaluates whether or not the voltage value (DET3) of the output signal from the low-pass filter 12 is greater than or equal to the predetermined value (S1082). FIG. 14C is a diagram showing a relationship between the power level of the desired wave and the voltage value (DET3) of the output signal from the low-pass filter 12. FIG. 14C shows a voltage change of the power level of the desired wave in five stages. As shown in FIG. 14C, when the power level of the desired wave is high, the output voltage value (DET3) from the low-pass filter 12 will become entirely high. Then, the power detection evaluation circuit 16 compares an expected value of the desired wave (a ninth threshold) with the output voltage value from the low-pass filter 12 so as to evaluate whether or not the power level of the desired wave is high (FIG. 10, S1082).

When the power level of the desired wave is low (FIG. 10, S1082: Yes), the power detection evaluation circuit 16 estimates that a total power level of the interference wave is high, together with the evaluation in S1081 in FIG. 10, and performs the evaluation on the CNR (FIG. 10, S1083). Meanwhile, when the power level of the desired wave (i.e., the voltage value (DET3)) is high (FIG. 10, S1082: No), the power detection evaluation circuit 16 evaluates that there is no poor reception due to an influence of the intermodulation distortion by the plurality of interference waves (FIG. 10, S1085).

Figure 14D:
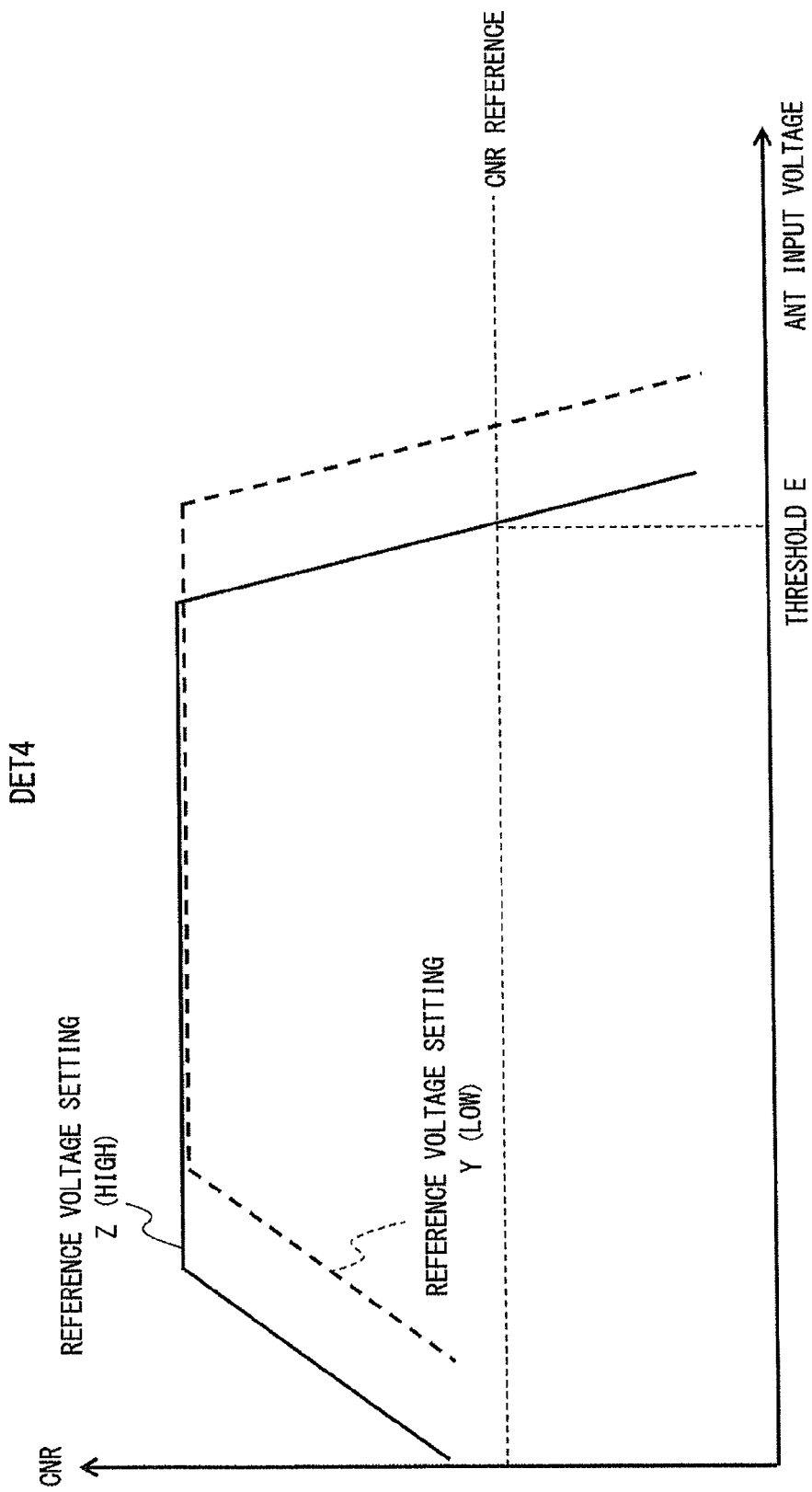
FIG. 14D is a diagram showing a relationship between the ANT input voltage and the CNR according to the second embodiment.

When the voltage value (DET1) is high (FIG. 10, S1081: Yes), and the power level of the desired wave is less than or equal to the certain value (FIG. 10, S1082: Yes), the power detection evaluation circuit 16 evaluates whether or not the CNR satisfies the quality reference value (FIG. 10, S1083). FIG. 14D is a diagram showing a relationship between the ANT input voltage and the CNR. As shown in FIG. 14D, when the ANT input voltage exceeds the certain value, the CNR will gradually decrease. The power detection evaluation circuit 16 evaluates whether or not the voltage value (DET4) satisfies the quality reference value (FIG. 10, S1083).

When the CNR (DET4) satisfies the quality reference value (FIG. 10, S1083: Yes), the power detection evaluation circuit 16 evaluates that there is no poor reception due to the influence of the intermodulation distortion by the plurality of interference waves (FIG. 10, S1085). When the CNR (DET4) does not satisfy the quality reference value (FIG. 10, S1083: No), the power detection evaluation circuit 16 evaluates that there is a poor reception due to the intermodulation distortion by the plurality of interference waves (FIG. 10, S1084). When the power detection evaluation circuit 16 evaluates that there is a poor reception due to the intermodulation distortion by the plurality of interference waves (FIG. 10, S1084), the power detection evaluation circuit 16 changes the setting so that the reference voltage=Y (W<=X<=Y<Z). Meanwhile, when the power detection evaluation circuit 16 evaluates that there is no poor reception due to the intermodulation distortion by the plurality of interference waves (FIG. 10, S1085), the power detection evaluation circuit 16 leaves the reference voltage as the initial value X.

Note that even when the above-mentioned evaluation on the CNR (FIG. 10, S1083) is not performed, the power detection evaluation circuit 16 can detect that the total voltage level of the plurality of interference waves is high.

By reducing the reference voltage (the reference voltage=Y), the CNR improves in a manner similar to the first embodiment. That is, the gain of the RFVGA 101 attenuates early (the dotted line in FIG. 14B). Then, the CNR (DET4) when the ANT input voltage is high improves (the dotted line in FIG. 14D).

Next, effects of the receiver 1 according to this embodiment shall be explained. As described above, the receiver 1 according to this embodiment has a configuration for controlling the RFAGC loop circuit 10 by the output signal from the low-pass filter 12. With this configuration, the receiver 1 detects the reception state from the antenna ANT (whether the adjacent channel interference wave exists, whether the reception level of the desired wave is high, and whether there is the influence by the plurality of interference waves) and controls the RFAGC loop circuit 10 according to a result of the detection. The receiver 1 accurately evaluates the reception state using each of the voltage values (DET0 to DET4) so as to optimize the gain control on the RFAGC loop circuit 10, thereby achieving an improvement in the reception performance.

Although the invention carried out by the present inventor has been explained in detail based on the embodiments, it is obvious that the present invention is not limited to the above-explained embodiments, and various modifications can be made without departing from the scope of the invention.

Note that the above-explained receivers 1 according to the first and second embodiments may be configured as a semiconductor integrated circuit on a semiconductor substrate.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A receiver comprising:
a voltage control variable gain amplifier to vary a gain to amplify a reception signal according to a gain control signal;
a filter circuit to filter a signal obtained by converting a frequency of an output signal from the voltage control variable gain amplifier;
a demodulator to generate a digital signal based on an output signal from the filter circuit, and to generate quality voltage information indicating a quality of the digital signal; and
a power detection evaluation circuit to perform evaluation processing to detect a plurality of kinds of poor reception states based on the quality voltage information in addition to at least one of a voltage value of the gain control signal, a voltage value of the output signal from the voltage control variable gain amplifier, a voltage value of the reception signal, a voltage value of the output signal from the filter circuit, and a voltage value of an intermediate node of the filter circuit, and controls the gain control signal when the power detection evaluation circuit detects one of the poor reception states so that the voltage value of the output signal from the voltage control variable gain amplifier becomes low,
wherein the power detection evaluation circuit compares a difference between the voltage value of the output signal from the filter circuit and the voltage value of the intermediate node with a first threshold, calculates a reception level of an interference wave of an adjacent channel of a desired wave in the reception signal according to the comparison, and changes the voltage value of the gain control signal according to whether or not the reception level is greater than or equal to a predetermined value.

2. The receiver according to claim 1, further comprising:
a conversion circuit to convert the frequency of an output signal from the voltage control variable gain amplifier, and
wherein the filter circuit filters the signal which is output from the conversion circuit.

3. The receiver according to claim 2, wherein the conversion circuit includes a mixer and an oscillator.

4. The receiver according to claim 1, wherein the filter circuit includes a multi-stage low-pass filter including an active element.

5. A semiconductor integrated circuit comprising the receiver according to claim 1.

6. The receiver according to claim 1, wherein when the reception level of the interference wave of the adjacent channel is less than the predetermined value, the power detection evaluation circuit evaluates that a power level of the desired wave is at a level which causes one of the poor reception states and changes the voltage value of the gain control signal.

7. The receiver according to claim 1, wherein when the reception level of the interference wave of the adjacent channel is less than the predetermined value, the voltage value of the gain control signal is less than or equal to a second threshold, and the voltage value of the output signal from the voltage control gain variable amplifier is greater than or equal to a third threshold, the power detection evaluation circuit evaluates that the power level of the desired wave is at a level which causes one of the poor reception states and changes the voltage value of the gain control signal.

8. The receiver according to claim 1, wherein when the reception level of the interference wave of the adjacent channel is less than the predetermined value, the voltage value of the gain control signal is less than or equal to a second threshold, and the voltage value of the output signal from the filter circuit is greater than or equal to a fourth threshold, the power detection evaluation circuit evaluates that the power level of the desired wave is at a level which causes one of the poor reception states and changes the voltage value of the gain control signal.

9. The receiver according to claim 1, wherein when the reception level of the interference wave of the adjacent channel is less than or equal to the predetermined value, the voltage value of the output signal from the voltage control gain variable amplifier is greater than or equal to a fifth threshold, the voltage value of the output signal from the filter circuit is less than or equal to a seventh threshold, and the quality voltage information does not satisfy a quality reference value, the power detection evaluation circuit evaluates that there is an influence of intermodulation distortion by a plurality of interference waves on the desired wave and changes the voltage value of the gain control signal.

10. The receiver according to claim 1, wherein when the reception level of the interference wave of the adjacent channel is less than the predetermined value, the voltage value of the gain control signal is less than or equal to a sixth threshold, the voltage value of the output signal from the filter circuit is less than or equal to a seventh threshold, and the quality voltage information does not satisfy a quality reference value, the power detection evaluation circuit evaluates that there is an influence of intermodulation distortion by a plurality of interference waves on the desired wave and changes the voltage value of the gain control signal.

11. The receiver according to claim 1, wherein when the reception level of the interference wave of the adjacent channel is less than or equal to the predetermined value, and there is a predetermined correlation between the voltage value of the reception signal and the voltage value of the output signal from the filter circuit, the power detection evaluation circuit evaluates that the power level of the desired wave is at a level which causes one of the poor reception states and changes the voltage value of the gain control signal.

12. The receiver according to claim 1, wherein when the reception level of the interference wave of the adjacent channel is less than or equal to the predetermined value, there is a predetermined correlation between the voltage value of the reception signal and the voltage value of the output signal from the filter circuit, and the quality voltage information does not satisfy a quality reference value, the power detection evaluation circuit evaluates that the power level of the desired wave is at a level which causes one of the poor reception states and changes the voltage value of the gain control signal.

13. The receiver according to claim 1, wherein when the reception level of the interference wave of the adjacent channel is less than or equal to the predetermined value, the voltage value of the reception signal is greater than or equal to an eighth threshold, the voltage value of the output signal from the filter circuit is less than or equal to a ninth threshold, and the quality voltage information does not satisfy a quality reference value, the power detection evaluation circuit evaluates that there is an influence of intermodulation distortion by a plurality of interference waves on the desired wave and changes the voltage value of the gain control signal.

14. The receiver according to claim 1, wherein when the reception level of the interference wave of the adjacent channel is greater than or equal to the predetermined value, the power detection evaluation circuit controls the gain control signal so that the voltage of the output signal from the voltage control gain variable amplifier will be the lowest.

15. A method for gain control comprising:
amplifying a reception signal by an amplifier, the amplifier having a variable gain which is controlled according to a gain control signal;
filtering a signal obtained by converting a frequency of the amplified signal;
generating a digital signal based on the filtered signal;
generating quality voltage information indicating a quality of the digital signal;
performing evaluation processing to detect a plurality of kinds of poor reception states based on the quality voltage information in addition to at least one of a voltage value of the gain control signal, a voltage value of the amplified signal, and a voltage value of the reception signal, a voltage value of the filtered signal, and a voltage value of an intermediate signal in the filtering; and
controlling the variable gain when the power detection evaluation circuit detects one of the poor reception states so that the voltage value of the amplified signal will become low,
wherein the control of the variable gain includes comparing a difference between the voltage value of the filtered signal and the voltage value of the intermediate signal with a first threshold, calculating a reception level of an interference wave of an adjacent channel of a desired wave in the reception signal according to the comparison, and changing the voltage value of the gain control signal according to whether or not the reception level is greater than or equal to a predetermined value.

* * * * *